United States Patent
Frey et al.

(10) Patent No.: US 8,748,998 B2
(45) Date of Patent: Jun. 10, 2014

(54) SENSOR MODULE

(75) Inventors: Jens Frey, Filderstadt (DE); Heribert Weber, Nuertingen (DE); Eckhard Graf, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 42 days.

(21) Appl. No.: 13/206,024

(22) Filed: Aug. 9, 2011

(65) Prior Publication Data
US 2012/0032283 A1 Feb. 9, 2012

(30) Foreign Application Priority Data

Aug. 9, 2010 (DE) .......................... 10 2010 039 057

(51) Int. Cl.
*H01L 29/84* (2006.01)
(52) U.S. Cl.
USPC .......................................................... 257/415
(58) Field of Classification Search
USPC ............... 257/226, 619, 685–686; 73/514.32; 438/51, 55, 64, 106–127
See application file for complete search history.

(56) References Cited

U.S. PATENT DOCUMENTS

| 7,214,999 | B2 * | 5/2007 | Holm et al. .................... 257/444 |
| 7,859,091 | B2 * | 12/2010 | Fujii et al. ..................... 257/684 |
| 2006/0258039 | A1 * | 11/2006 | Lutz et al. ........................ 438/50 |
| 2008/0290490 | A1 * | 11/2008 | Fujii et al. ..................... 257/684 |
| 2009/0107949 | A1 * | 4/2009 | Kouma et al. .................... 216/11 |
| 2010/0005884 | A1 * | 1/2010 | Weinberg et al. .......... 73/504.15 |
| 2010/0242600 | A1 * | 9/2010 | Lin et al. .................... 73/504.12 |

* cited by examiner

*Primary Examiner* — Vongsavanh Sengdara
*Assistant Examiner* — Ismail Muse
(74) *Attorney, Agent, or Firm* — Kenyon & Kenyon LLP

(57) ABSTRACT

A sensor module includes a substrate system which has multiple substrates situated one on top of the other and connected in each case via a wafer bond connection. The substrate system includes at least one first sensor substrate and at least one second sensor substrate, the first sensor substrate having a first sensor structure and the second sensor substrate having a second sensor structure. The first and second sensor structures are designed for detecting different characteristics. At least the first sensor structure includes a micromechanical functional structure. Moreover, a method for manufacturing such a sensor module is disclosed.

8 Claims, 18 Drawing Sheets

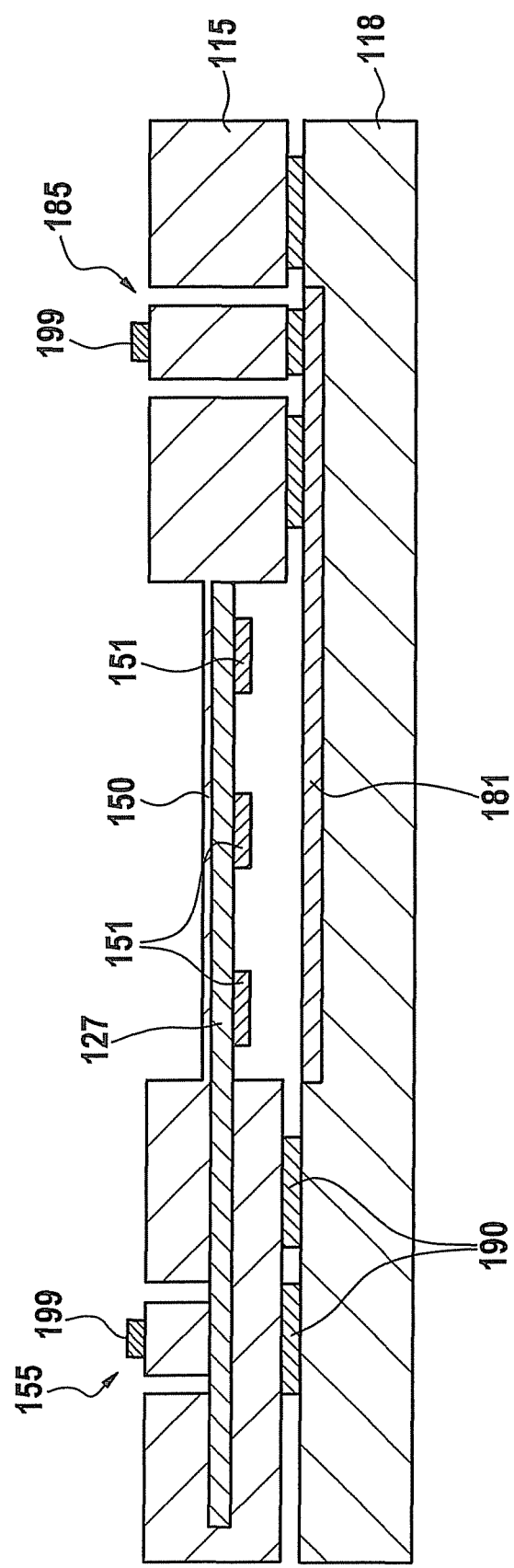

SENSOR MODULE

CROSS-REFERENCE TO RELATED APPLICATIONS

The present application claims priority to Application No. 10 2010 039 057.7, filed in the Federal Republic of Germany on Aug. 9, 2010, which is expressly incorporated herein in its entirety by reference thereto.

FIELD OF THE INVENTION

The present application relates to a sensor module which has a substrate system having multiple substrates situated one on top of the other. Moreover, the present application relates to a method for manufacturing such a sensor module.

BACKGROUND

Sensor devices which have a number of sensor substrates having different sensor structures for detecting various characteristics are being increasingly used in various applications. Such sensor devices, also referred to as "multisensor chips" or "sensor modules," are designed, for example, for detecting yaw rates and accelerations in various directions/planes, and optionally also for detecting pressures and/or temperatures.

In a conventional design of a sensor module, the individual sensor substrates are adjacently situated on a carrier substrate and connected to an evaluation circuit, which is usually designed in the form of an application-specific integrated circuit (ASIC). To minimize the space requirements, designs have also been developed in which sensors are placed directly on ASIC chips which are used as a carrier substrate.

In such designs of sensor modules, the occupied surface area can be further minimized only by reducing the size, i.e., the chip dimensions, of the sensor chips and/or the ASIC chips.

SUMMARY

The object of the present invention is to provide an improved approach for a sensor module which has small space requirements.

This object is achieved by a sensor module as described herein and by a method for manufacturing a sensor module as described herein. Further advantageous specific embodiments of the present invention are described in further detail below.

According to exemplary embodiments of the present invention, a sensor module is proposed which has a substrate system having multiple substrates situated one on top of the other and connected in each case via a wafer bond connection. The substrate system includes at least one first sensor substrate and at least one one second sensor substrate. The first sensor substrate has a first sensor structure, and the second sensor substrate has a second sensor structure. The first and second sensor structures are designed for detecting different characteristics. At least the first sensor structure includes a micromechanical functional structure.

The superposed configuration of the substrates, which (in each case) are connected to one another via a wafer bond connection, makes it possible to implement the sensor module having small lateral and vertical space requirements. It is also possible for the second sensor substrate at the same time to be used as a cap for the first sensor substrate in order to form a closed cavity in the region of the first sensor structure of the first substrate which is hermetically sealed from the surroundings. In addition, the wafer bond connections may have an electrically conductive design, and therefore may be used for (mechanically) connecting the substrates as well as for allowing electrical connections. Such characteristics allow a relatively compact design of the sensor module, which also results in cost savings.

In accordance with a preferred specific exemplary embodiment, the sensor module has contact plungers for contacting the substrate system. The contact plungers contain substrate material of substrates of the substrate system, i.e., are formed by substrate material of individual substrates. Such contact plungers may be easily provided within the scope of an etching process after the substrates of the substrate system are stacked.

In accordance with another preferred specific exemplary embodiment, the sensor module has a contact plunger in the form of a feedthrough structure which is enclosed by a trench structure and contains material of at least two different substrates of the substrate system. Such a feedthrough structure, which may be produced together with other contact plungers, allows contacting of the substrate system at the same level or height.

In accordance with another preferred specific exemplary embodiment, it is provided that the trench structure which encloses the feedthrough is filled with a filling material. The contact plunger in question may thus have higher mechanical stability.

In accordance with another preferred specific exemplary embodiment, the contact plungers are situated at different levels of the substrate system. Compared to a feedthrough which extends over multiple levels, the contact plungers may have a relatively low height and, therefore, reliable mechanical stability.

With regard to the contact plungers, it is also possible that they are contactable from the same side or from different sides of the substrate system. Contactability from the same side may allow simple and rapid contacting of the substrate system if necessary. On the other hand, contactability from different sides may optionally provide higher flexibility with regard to assembly and connection technology. In particular, different contacting methods may be considered. Thus, for example, one side (in particular the bottom side) may be contacted using a soldering agent, employing a flip-chip process, while the other side (in particular the top side) is contacted via bonding wires.

In accordance with another preferred specific exemplary embodiment, the substrate system includes an additional substrate besides the first and second sensor substrates. The additional substrate is situated between the first and second sensor substrates or on one side of the substrate system. The additional substrate may be provided without any sensor structures, and therefore used solely as a separating substrate or cap substrate for the first and/or second sensor substrate.

In accordance with another preferred specific exemplary embodiment, the additional substrate has integrated circuit structures which are electrically connected to the sensor structures of the first and second sensor substrates. In this design, the circuit structures of the additional substrate may form an evaluation circuit for evaluating signals of the sensor structures of the first and second sensor substrates. A portion of the electrical connection between the integrated circuit structures and the sensor structures may be established via electrically conductive wafer bond connections.

Various designs may be considered for the first sensor substrate having the micromechanical sensor or functional structure. The first sensor substrate or its sensor structure may be designed for detecting an acceleration, a yaw rate, or a pressure, for example. Such designs may be similarly considered for the second sensor substrate. In addition, the first and/or second sensor substrate may be additionally or alternatively designed for detecting other characteristics, for example for magnetic field measurement, temperature measurement, or measurement of infrared radiation.

Moreover, in accordance with exemplary embodiments of the present invention, a method for manufacturing a sensor module is proposed. In the method, multiple substrates are connected to a substrate system composed of multiple substrates situated one on top of the other, with the aid of wafer bonding. The substrate system includes at least one first sensor substrate and one second sensor substrate. The first sensor substrate has a first sensor structure, and the second sensor substrate has a second sensor structure. The first and second sensor structures are designed for detecting various characteristics. At least the first sensor structure includes a micromechanical functional structure.

As a result of the superposed configuration of the substrates, the sensor module may be implemented with small lateral surface area requirements, i.e., a compact design. In addition, hollow spaces or cavities, which are enclosed between the substrates and in which different gas or pressurized atmospheres which are coordinated with the sensor structures may be set, may be formed in the region of the sensor structures.

Further features and aspects of exemplary embodiments of the present invention are explained in greater detail below with reference to the appended Figures.

BRIEF DESCRIPTION OF THE DRAWINGS

FIGS. 14 to 18 show schematic side illustrations of further sensor modules.

DETAILED DESCRIPTION

Sensor modules and possible methods for manufacturing sensor modules are described with reference to the following figures, multiple semiconductor substrates being connected to one another by wafer bonding. Processes and materials which are common in semiconductor and microsystem technology may be used in the manufacturing methods; therefore, these are not discussed in detail. It is further pointed out that other processes may be carried out in addition to the method steps illustrated and described, and that other materials may be used instead of the named or described materials.

Figure 1:
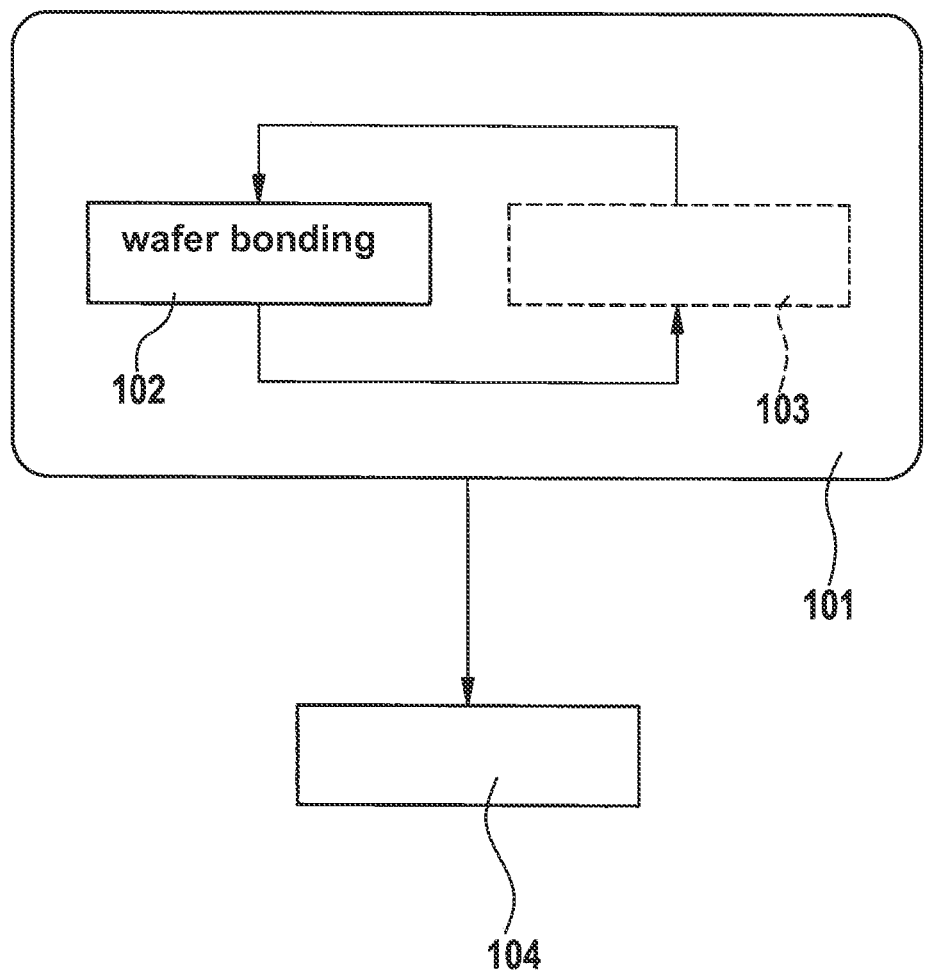
FIG. 1 shows a schematic diagram for illustrating steps of a method for manufacturing a sensor module.

FIG. 1 shows a schematic diagram of a method in which steps for manufacturing a sensor module are illustrated. In the method, a system which includes multiple substrates or wafers situated one on top of the other is produced within the scope of a step 101. The superposed configuration of the substrates offers the possibility of reducing the space or surface area requirements of the sensor module, and thus, implementing the sensor module with small lateral dimensions.

The substrate system is composed of at least two sensor substrates, it being possible for the two sensor substrates to have different sensor structures. The different sensor structures may be designed for detecting different physical characteristics, for example. In addition, at least one sensor structure of a sensor substrate includes a micromechanical functional structure, i.e., a microstructure, which has at least one movable or deformable functional element. Such a microstructure, also referred to as a microelectromechanical system (MEMS) structure, is designed, for example, to detect an acceleration, a yaw rate, or a pressure. During operation of such sensors, a deflection or deformation of a functional element is detected, for example, by a change in the electrical capacitance compared to a fixed reference electrode or counter electrode. The deflection or deformation of a functional element may also be detected based on the deformation of a piezoresistive resistor element. In addition to sensor substrates, the substrate system may also include (at least) one additional substrate which is provided between two sensor substrates, or alternatively, situated on one side (i.e., the top side or bottom side) of the substrate system.

For manufacturing the substrate system, the individual substrates or wafers are provided and are connected to one another (in each case) by carrying out a wafer bonding process or by successively carrying out wafer bonding processes, denoted in FIG. 1 by a step 102. In addition, further processes may be carried out subsequent to the formation of a wafer bond connection between two substrates, or between successive wafer bonding processes, as illustrated in FIG. 1 by a further step 103. These include, for example, a (back side) grinding process in order to thin a bonded substrate ("back-thinning"), and therefore to reduce the overall thickness of the substrate system and thus of the sensor module. Step 103 may also include formation of one or multiple depressions in a substrate. This may allow, for example, a greater freedom of motion for a movable functional element of a sensor substrate which is bonded to a substrate having such a depression.

The terms "wafer bonding," "wafer bond connection," etc., used herein refer to connection processes which may be carried out at the wafer level, in which two substrates or wafers may be connected to one another via appropriate intermediate or connecting layers. It is thus possible to form strong, vacuum-tight bond connections which may also be electrically conductive, depending on the materials used.

Electrically conductive connections may be produced in particular using a metallic or eutectic wafer bonding process. For such a connection technique, the involved substrates have materials or layers which are coordinated with one another, and which during the bonding process are pressed together and form a eutectic under the action of heat. Examples of materials or layer systems which are suitable for eutectic bonding include Al—Ge, Au—Si, or Au—Ge layer systems.

It is also possible to carry out thermocompression bonding, in which the connecting layers of the involved substrates are connected by the action of heat, high pressure, and optionally ultrasound or megasound to form a combined electrically conductive connecting structure. Thermocompression bonding may be carried out, for example, using two Cu layers which are connected to form a combined Cu layer. Alternatively, other materials or metals such as two Au or Ti layers, for example, may be used.

In addition, another bonding or connecting material, such as glass solder or seal glass, for example, may be used which is provided on one or both of the substrates to be connected, and which is melted on under the action of heat. A wafer bond connection made of seal glass, which is not electrically conductive, may be suitable, for example, for a substrate which is used solely as a cap and is provided on a top or bottom side of the substrate system.

In addition to meeting small lateral space requirements, the stacking of the substrates, (in each case) between two substrates, allows formation of a closed hollow space (also referred to as cavity or cavern), which is hermetically sealed from the surroundings, in the region of a sensor structure, one substrate being used as a cap for another substrate. Such a cavity is delimited by the mutually connected substrates and the associated wafer bond connection. For this purpose, the wafer bond connection usually has a design which is frame-shaped or provided with a frame-shaped subregion, also referred to as a "bond frame." The connection of the corresponding substrates may be carried out at a specified gas or pressurized atmosphere in order to set a specified gas or pressurized atmosphere in the associated cavity which is specified for an optimal operating method of the sensor structure in question. In this regard, it is also possible to connect two sensor substrates directly to one another, so that one sensor substrate at the same time functions as a cap for the other sensor substrate.

Multiple successive wafer bonding processes may also be carried out at different gas or pressurized atmospheres. In this way, different gas or pressurized atmospheres may be set in various cavities which are appropriately coordinated with individual sensor structures. Different internal pressures for cavities may be considered for a combination of yaw rate sensors and acceleration sensors, for example.

Multiple successive wafer bonding processes are also preferably carried out in such a way that a bonding process does not result in impairment of a wafer bond connection established in a previous bonding process. This may be achieved in particular by mutually coordinated bonding conditions and/or an appropriate selection of the materials used in the wafer bonding processes.

For example, in the production of eutectic wafer bond connections for two successive bonding processes, in each case the same layer system, for example an Al—Ge layer system, may be selected, the first of the two bonding processes being carried out at a higher bonding temperature than the second bonding process. In addition, it is possible to select in a targeted manner mixing ratios of the bonding materials used in order to specify a higher melting point for the first bonding process than for the second bonding process. It is also conceivable to carry out the first bonding process as a eutectic bonding process using an Al—Ge layer system, for example, whose eutectic point (melting point) is 420° C. The second bonding process may be carried out, for example, using an Au—Si layer system (eutectic point at 363° C.) or an Au—Ge layer system (eutectic point at 361° C.). It is also possible to provide seal glass bonding instead of eutectic bonding for the second bonding process, the bonding temperature of the second bonding process being selected to be lower than that of the first bonding process. Such procedures may be similarly considered also for more than two successive wafer bonding processes.

After the substrates are stacked within the scope of step 101, further processes are carried out which are summarized in a step 104 in FIG. 1. These include, for example, carrying out an etching process in order to produce contact plungers or contact columns from substrate material of the substrates, via which the sensor structures of the sensor substrates may be contacted. In this regard, the substrates or sensor substrates may be provided with appropriate doping (at least in the region of the contact plungers) to allow electrical conductivity. In addition, as described in greater detail below, the substrates may have a design in which all contact plungers may be produced in a single etching process.

Another possible process within the scope of step 104 is a separation process for providing separate sensor modules. In addition, step 104 may include, for example, placing a (separated) sensor module on a carrier or carrier substrate, for example an ASIC chip, contacting the sensor module, for example for establishing an electrical connection using an ASIC chip, and placing the sensor module in a housing.

Possible or advantageous embodiments of the method of FIG. 1 as well as possible or advantageous embodiments of sensor modules are described with reference to the following figures. It is pointed out that only details of the corresponding substrates or wafers are illustrated in the following figures, and that within the scope of a manufacturing method the illustrated structures and elements may be adjacently implemented numerous times on the illustrated substrates in order to produce a plurality of sensor modules essentially at the same time, i.e., in parallel.

Figure 2:
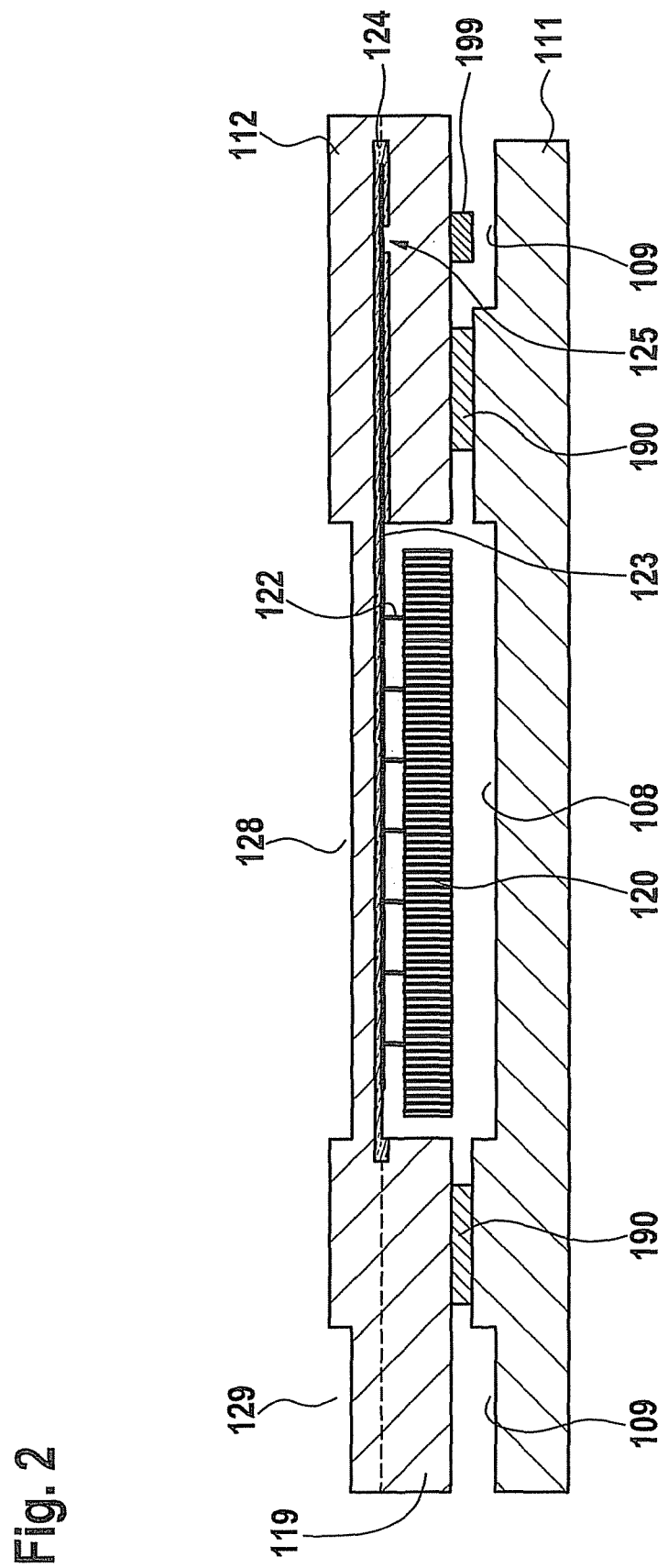
FIGS. 2 to 4 show the manufacture of a sensor module by connecting substrates, in each case in a schematic side illustration.
Figure 3:
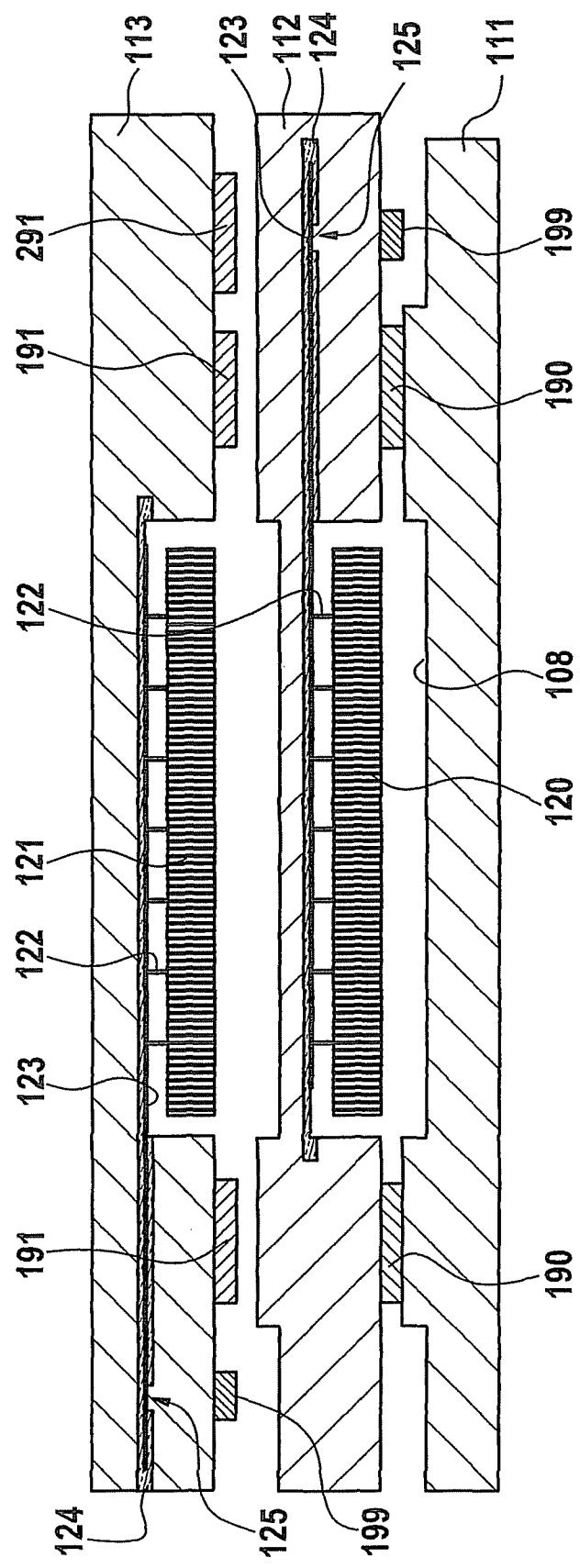
Figure 4:
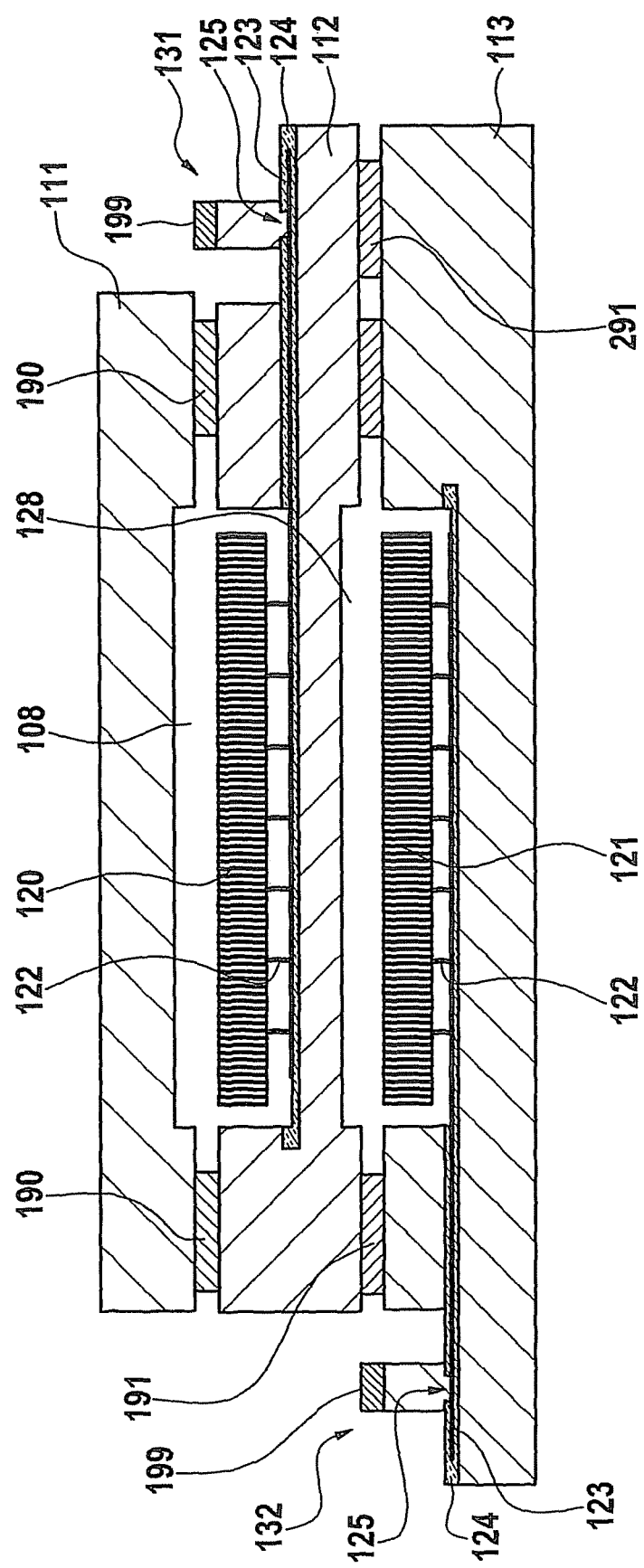

FIGS. 2 through 4 show the manufacture of a sensor module, in each case in a schematic side illustration. The starting point of the method is a substrate 111 without a sensor structure, which may be a standard wafer made of silicon. As illustrated in FIG. 2, substrate 111 may have depressions 108, 109. As a result of depressions 109, the etching time for an etching process carried out in a subsequent method stage for producing contact plungers 131, 132 (see FIG. 4) may be shortened.

Depression 108 is selected with regard to a sensor substrate 112 having a micromechanical functional structure 120, and subsequently applied to substrate 111, in such a way that greater freedom of motion is provided for movable functional elements of functional structure 120. As illustrated in FIG. 2, sensor substrate 112 is bonded to substrate 111 with the top side directed downwardly, i.e., upside down.

Sensor substrate 112, whose functional structure 120 is designed for detecting an acceleration or a yaw rate, for example, may be produced in a customary manner by carrying out semiconductor or MEMS fabrication processes. The system illustrated in FIG. 2 is produced on a starting substrate 112, which may be a standard silicon wafer, for example. In addition to functional structure 120, which is formed from an electrically conductive functional layer 119 indicated in FIG. 2, a printed conductor structure 123 which is (partially) buried or (partially) bordered by an insulating layer 124 is also included. Printed conductor structure 123 is used for contacting functional elements of functional structure 120. Functional structure 120 is also electrically connected to printed conductor structure 123 via connecting or support elements 122, indicated in FIG. 2, which likewise may be formed from material of functional layer 119. In addition, in the region of the functional elements, printed conductor structure 123 may include one or multiple counter electrodes (not illustrated) which is/are associated with the functional elements.

In the production of functional structure 120 from functional layer 119, trench etching (also referred to as trenching), for example, may be carried out, with the aid of which functional elements of functional structure 120 are prestructured. For the trench etching, insulating layer 124 (which may be made of multiple layers, including a sacrificial layer) may function as an etching stop layer at which the trench etching process is terminated. Gas phase etching (using hydrofluoric acid vapor, for example) may be subsequently carried out, in the course of which the functional elements of functional structure 120 are exposed by etching the sacrificial layer.

In a region 125, referred to below as opening region 125, insulating layer 124 is removed as illustrated in FIG. 2 so that printed conductor structure 123 is able to directly adjoin substrate material of sensor substrate 112 (or functional layer 119 thereof). An electrical connection between printed conductor structure 123 and a contact plunger 131 which is subsequently produced at this location (see FIG. 4) is thus made possible. In this region a contact surface or "bond pad" 199 is also provided on sensor substrate 112 (i.e., on functional layer 119).

It is pointed out that sensor substrate 112 is provided with multiple opening regions 125 and contact surfaces 199; i.e., multiple contact plungers 131 associated with opening regions 125 are produced on sensor substrate 112, via which contacting of functional elements of functional structure 120 (and optionally of counter electrodes of printed conductor structure 123) is made possible. Opening regions 125, contact surfaces 199, and thus also subsequently produced contact plungers 131 may be situated, for example, perpendicularly to the plane of the drawing in FIG. 2, and may be offset with respect to one another, for example in a region along or parallel to a subsequently produced edge or an edge side of the sensor module.

Functional layer 119 of sensor substrate 112 may be a so-called epi-polysilicon layer, i.e., a polycrystalline silicon layer which is produced in an epitaxial process and which may have a doped design. Silicon oxide, for example, is suitable for insulating layer 124, and (doped) polysilicon, for example, is suitable for printed conductor structure 123. Contact surfaces 199 may, for example, include a metallic material such as Al, Al—Cu, or Al—Si—Cu, for example.

Sensor substrate 112 is provided by carrying out a wafer bonding process on substrate 111, and therefore, according to the bonding process as illustrated in FIG. 2, is connected to substrate 111 via a connecting structure 190, also referred to below as wafer bond connection 190. Known bonding processes such as seal glass bonding, thermocompression bonding, or eutectic bonding, for example, may be carried out using Al—Ge, Au—Si, or Au—Ge bonding systems, for example, so that wafer bond connection 190 includes a seal glass, a metallic material, or a eutectic. Connecting structure 190 as seen in the top view may have the shape of a closed frame (or of a frame-shaped subsection), so that a cavity is present in the region of functional structure 120 via which functional structure 120 is hermetically sealed from the surroundings. In this regard, the connection of substrates 111, 112 may also be carried out at a specified gas or pressurized atmosphere in order to set a gas or pressurized atmosphere in the cavity which is suitable for an optimal mode of operation of functional structure 120.

After substrates 111, 112 are connected by wafer bonding, a (back side) grinding process may optionally be carried out on sensor substrate 112, substrate material of substrate 112 being removed at its back side (i.e., the top side in FIG. 2). As a result of this "back-thinning," the overall thickness of the substrate system, and thus of the sensor module, may be reduced. Another advantage is that the etching time for the etching process carried out in a subsequent method stage for producing contact plungers 131, 132 may be (further) shortened.

As illustrated in FIG. 2, back-side depressions 128, 129 may optionally also be provided on sensor substrate 112. As a result of depression 129, the etching process which is subsequently carried out for producing contact plungers 131, 132 may once again be facilitated; i.e., its etching time may be reduced.

Depression 128 is selected with regard to an additional sensor substrate 113 having a micromechanical functional structure 121, subsequently applied to substrate 112, in such a way that greater freedom of motion is provided for movable functional elements of functional structure 121. As illustrated in FIG. 3, additional sensor substrate 113 is likewise bonded to substrate 112 with the top side directed downwardly.

Sensor substrate 113 has a design which is comparable to sensor substrate 112, and in addition to sensor structure or functional structure 121 once again has a printed conductor structure 123 which is (partially) bordered by an insulating layer 124 and is connected to functional structure 121 via connecting elements 122. Functional structure 121 of sensor substrate 113 is designed for detecting a different characteristic than functional structure 120 of the other sensor substrate 112. For example, functional structure 120 may be designed for detecting an acceleration and functional structure 121 may be designed for detecting a yaw rate, or conversely, functional structure 120 may be designed for detecting a yaw rate and functional structure 121 may be designed for detecting an acceleration. Despite these different modes of operation, sensor substrate 113 may be produced in a manner identical or similar to sensor substrate 112 (for example, producing functional structure 121 from a functional layer not illustrated in FIG. 3). With regard to further features and details which correspondingly also apply to sensor substrate 113, reference is therefore made to the above discussion regarding sensor substrate 112.

Opening regions 125 (of which only one opening region 125 is illustrated in FIG. 3) are also provided in insulating layer 124 on sensor substrate 113, in which printed conductor structure 123 may directly adjoin the substrate material of sensor substrate 113 in order to allow an electrical connection to contact plungers 132 which are subsequently produced at this location (see FIG. 4). Sensor substrate 113 also has associated contact surfaces 199 in this region. Opening regions 125, contact surfaces 199, and therefore also contact plungers 132 which are subsequently produced may be situated, for example, perpendicularly to the plane of the drawing in FIG. 3, and may be offset with respect to one another, for example in a region along or parallel to a subsequently produced edge or an edge side of the sensor module.

In the bonding process, sensor substrate 113 is bonded to sensor substrate 112 in such a way that opening regions 125 and contact surfaces 199 of sensor substrate 113 are provided at a different location in the substrate system than opening region 125 and contact surfaces 199 of sensor substrate 112. In the exemplary embodiment shown in FIG. 3, these structures are located at opposite sides (i.e., on the right and left sides), so that associated contact plungers 131, 132 may be produced at opposite edge sides of the subsequent sensor module (see FIG. 4).

Sensor substrate 113 is also connected to sensor substrate 112 by carrying out a wafer bonding process which is eutectic, for example, and, as illustrated in FIG. 3, is therefore connected to sensor substrate 112 via a wafer bond connection 191. This wafer bonding process is carried out in such a way that damage to or impairment of the previously produced wafer bond connection 190 between sensor substrate 112 and substrate 111 is avoided. This may be achieved, as described above, by mutually coordinated bonding conditions and/or an appropriate selection of the materials used in the wafer bonding processes.

Bond connection 191 has a subsection which (in the top view) is situated in a frame-shaped manner around functional structure 121, so that a cavity is present in the region of functional structure 121 via which functional structure 121 is hermetically sealed from the surroundings. In this regard, the connection of substrates 112, 113 may be carried out at a specified gas or pressurized atmosphere in order to set a gas or pressurized atmosphere in the cavity which is suitable for an optimal mode of operation of functional structure 121. This gas or pressurized atmosphere may be different from the atmosphere used for connecting substrates 111, 112.

In addition to the section which encloses functional structure 121 in a frame-shaped manner, bond connection 191 also has a further (optionally separate) section 291 which is provided in the region of contact surfaces 199 (and therefore in the region of subsequent contact plungers 131) of sensor substrate 112. This section of bond connection 191 may be used in a subsequent wire bonding process, in which a bonding wire is connected to a contact surface 199 of a contact plunger 131 of sensor substrate 112, to prevent bending of sensor substrate 112 and to securely couple the applied bonding force into respective contact surface 199 of contact plunger 131.

After sensor substrates 112, 113 are connected by wafer bonding, a (back side) grinding process may optionally also be carried out on sensor substrate 113, substrate material of substrate 113 being removed on its back side (i.e., the top side in FIG. 3). The system in FIG. 3 is further brought into an upside-down position illustrated in FIG. 4, in which back-grinding of substrate 111 which is used as a cap wafer for sensor substrate 112 may optionally (also) be carried out.

In addition, a dry etching or plasma etching process is carried out, using an etching mask situated on substrate 111 (in particular in the region of sensor structures 120, 121), in order to produce contact plungers or contact columns 131, 132 (also referred to as "bond pad plungers" or "contact elevations") on substrates 112, 113, and therefore at different levels. Contact plungers 131, 132, which are contactable from the same side (top side) of the substrate stack shown in FIG. 4, contain, in addition to contact surfaces 199, substrate material of associated sensor substrates 112, 113 (or material from their functional layers).

In the course of the etching process, contact surfaces 199 are used for masking the substrate material situated thereberneath in each case. In addition, the two insulating layers 124 of sensor substrates 112, 113 are used as etching stop layers or etching stop levels on which the etching process is terminated within the particular sensor substrates 112, 113, insulating layers 124 at these locations being partially exposed. Since after producing contact plungers 131 of sensor substrate 112 (in the upper section of FIG. 4), remaining sensor substrate 112 is etched in the region of contact plungers 132 of sensor substrate 113 (in the lower section of FIG. 4) and contact plungers 132 are produced, insulating layer 124 of sensor substrate 112 has a correspondingly great thickness and/or a correspondingly high etch resistance in order to avoid an etching attack associated with exposing associated printed conductor structure 123.

After carrying out the etching process, further processes may be carried out to conclude the production of the sensor module illustrated in FIG. 4. This includes in particular a separation process for providing the sensor module separately from other sensor modules. The separation allows the above-mentioned edges or edge sides of the sensor module to be established. In addition, the sensor module may be electrically connected to an evaluation circuit or an ASIC chip, and situated in an appropriate housing, for example (not illustrated). For an electrical connection, bonding wires, for example, may be connected to contact plungers 131, 132 or their contact surfaces 199 situated at different levels, the bonding wires being further connected to buried printed conductor structures 123 of sensor substrates 112, 113 via opening regions 125. Since contact plungers 131, 132 are contactable from the same side, simple and rapid contacting of the sensor module is made possible.

Further sensor modules are described which have a design that is similar or comparable to the sensor module of FIG. 4, with reference to the following figures. Therefore, with regard to previously described details which relate to usable method steps, mutually corresponding structures, possible materials, stated advantages, etc., reference is made to the preceding discussion. At this point it is further noted that, in comparison to sensor substrates 112, 113 of FIGS. 2 through 4, opening regions 125 provided in subsequent sensor substrates 112, 113 may allow an electrical connection of a printed conductor structure 123 to other sides (top or bottom side), depending on the particular substrate system.

Figure 5:
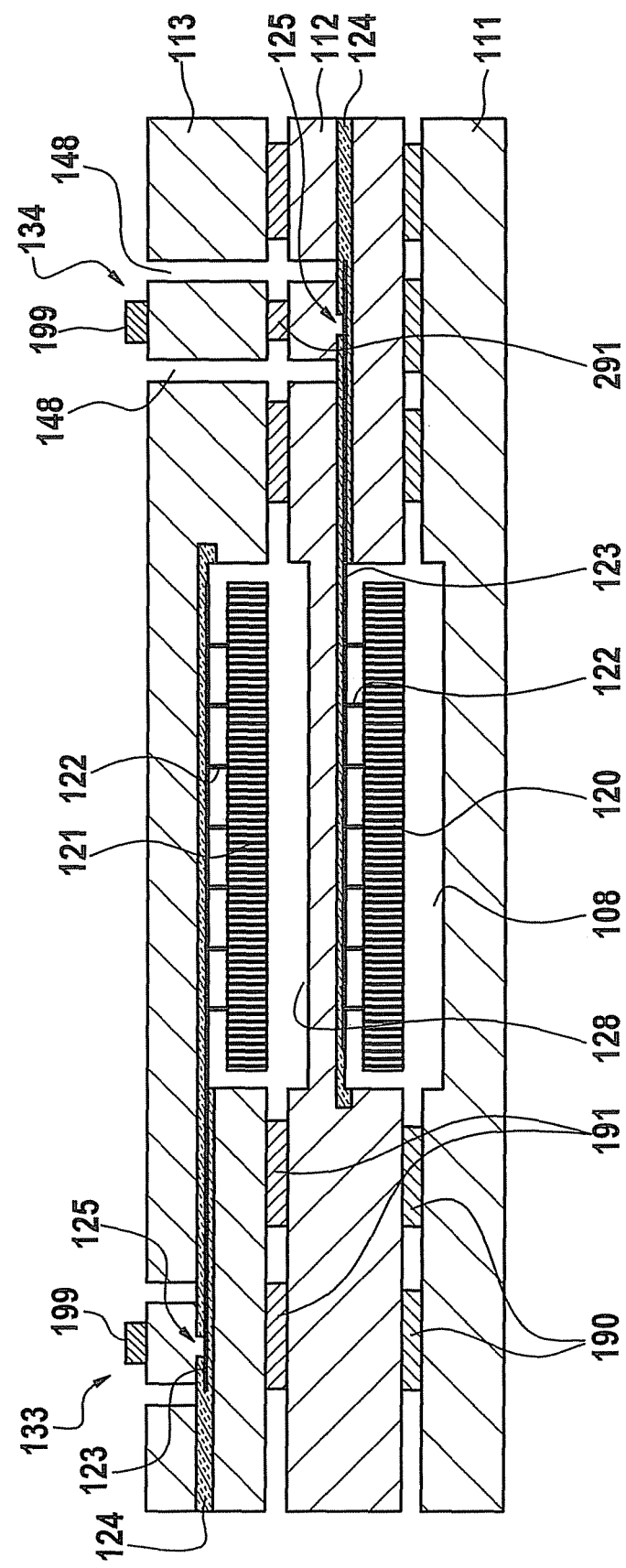
FIGS. 5 to 11 show schematic side illustrations of further sensor modules.

Instead of producing a sensor module in which contacts or contact surfaces 199 are present at different levels, alternative manufacturing methods may be carried out in order to provide all contact surfaces 199 at the same height on one side of a wafer stack. A sensor module having such a design is shown in FIG. 5 for purposes of illustration. The production of this sensor module, which is described below, does not differ significantly from the procedure described with reference to FIGS. 2 through 4.

A sensor substrate 112 having a micromechanical functional structure 120 is bonded to a substrate 111, which once again functions solely as a cap wafer. Wafer bond connection 190 which is produced thereby has a frame-shaped section which encloses functional structure 120, as well as additional bond structures or sections next to or outside the frame-shaped section which are selected with regard to subsequently produced contact plungers 133, 134. Sensor substrate 112 is optionally back-thinned after the bonding. An additional sensor substrate 113 having a micromechanical functional structure 121 is also bonded to sensor substrate 112.

Sensor substrate 113 is bonded to sensor substrate 112 in such a way that opening regions 125 of sensor substrate 113, via which a printed conductor structure 123 which is bordered by an insulating layer 124 may directly adjoin substrate material of sensor substrate 113, are situated at a different location than corresponding opening regions 125 of sensor substrate 112. In the exemplary embodiment shown in FIG. 5, these structures are present at opposite sides (i.e., the right and left sides), so that contact plungers 133, 134 associated with opening regions 125 may be produced in the region of oppositely situated edges of the subsequent, i.e., separated, sensor module.

Wafer bond connection 191 which is produced between sensor substrates 112, 113 during the bonding process has a frame-shaped section which encloses functional structure 121, as well as additional bond structures or sections next to or outside the frame-shaped section which are selected with regard to subsequently produced contact plungers 133, 134. These include in particular separate bond structures 291 which are associated with contact plungers 134 of sensor substrate 112 which are subsequently produced, or which form a component of these contact plungers 134. Contact surfaces 199 which are situated in the region of opening regions 125 of both sensor substrates 112, 113 are subsequently produced on a back surface of sensor substrate 113.

In addition, an etching process is carried out using an etching mask which is appropriately provided on substrate 113, in the course of which contact plungers 133, 134 are produced. The etching mask may be provided for masking in the region of sensor structures 120, 121 as well as for (optional) masking in the region of contact surfaces 199, so that contact plungers 133, 134 as illustrated in FIG. 5 may have larger lateral dimensions than associated contact surfaces 199. Alternatively, in this region it is possible to use contact surfaces 199 for masking the particular substrate material situated therebeneath, so that the corresponding contact plungers (comparable to contact plungers 131, 132 of FIG. 4) may have the same lateral dimensions as contact surfaces 199.

In the etching process, insulating layers 124 of the two sensor substrates 112, 113 are once again used as etching stop layers at which the etching process is terminated. In this way, by etching a portion of sensor substrate 113, contact plungers 133 are produced on sensor substrate 113 (at the upper section of FIG. 5) which are formed solely from the substrate material of sensor substrate 113, and which allow contacting of printed conductor structure 123 of sensor substrate 113. To achieve sufficient electrical conductivity of contact plungers 133, substrate 113 is provided with appropriate doping, at least at this location.

Contact plungers 134 are produced on sensor substrate 112 (in FIG. 5, beneath sensor substrate 113) by completely etching away sensor substrate 113 and etching a portion of sensor substrate 112, the contact plungers thus representing feedthrough structures which allow contacting of a printed conductor structure 123 of sensor substrate 112. Each contact plunger 134 includes material from both sensor substrates 112, 113 and in each case an associated section 291 of wafer bond connection 191. In addition, each contact plunger 134 is enclosed by an etching trench or a portion of a contiguous trench structure 148 which completely penetrates sensor substrate 113. To ensure that contact plungers 134 are electrically conductive, the above-described connection of the two sensor substrates 112, 113 is carried out using a eutectic wafer bonding process or a thermocompression bonding process, so that wafer bond connection 191 and therefore sections 291 contain an electrically conductive material. Both substrates 112, 113 are also provided with appropriate doping, at least in this region.

Subsequent to these method steps, it is also possible for the sensor module of FIG. 5 to grind back substrate 111, which is used as a cap wafer. In addition, further processes such as a separation process in particular may be carried out in order to provide the sensor module separately from other sensor modules.

In the sensor module of FIG. 5, buried printed conductor structures 123 of sensor substrates 112, 113 and therefore their functional structures 120, 121 may be contacted via contact surfaces 199, situated at the same level, of contact plungers 133, 134 associated with sensor substrates 112, 113. The contacting of the sensor module, which may be achieved with the aid of bonding wires, for example, may be simplified, if necessary, on these contact plungers.

Figure 6:
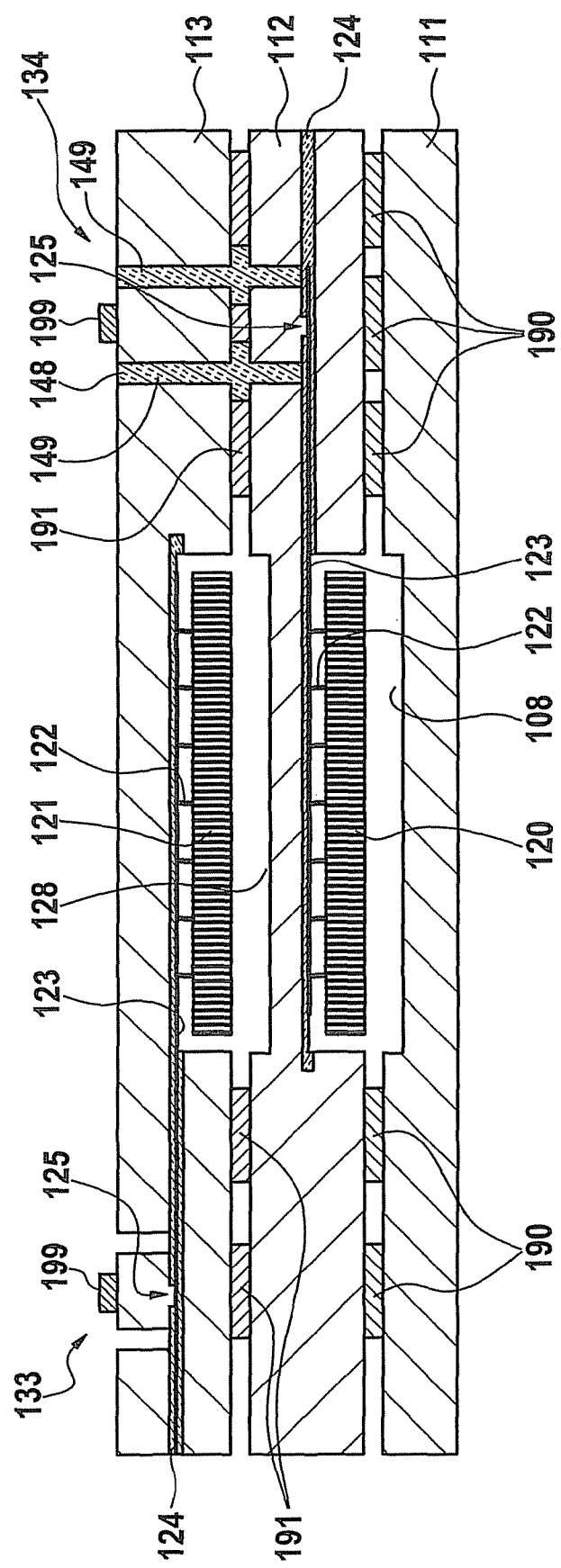

FIG. 6 shows another possible embodiment of a sensor module which essentially corresponds to the sensor module of FIG. 5. The sensor module of FIG. 6 also has an electrically insulating filling material 149 which is introduced into trench structure 148 surrounding contact plungers 134 of sensor substrate 112. In this way the mechanical stability of contact plungers 134 may be increased, and protection from penetration of moisture and/or dirt into trench structure 148 may be achieved. Such a filling may optionally also be considered for the trench structure surrounding contact plungers 133 of sensor substrate 113. Furthermore, it is pointed out that trench structures 148 may also be filled for the sensor modules illustrated in the other figures.

A number of different electrically insulating materials are suitable for filling material 149. Possible examples are benzocyclobutene (BCB) and polyimide, which may be introduced in liquid form into trench structure 148 and which subsequently are able to solidify and cure. In addition, an oxide material may be used which is introduced into trench structure 148 within the scope of a chemical vapor deposition (CVD) process, for example. Instead of completely filling trench structure 148, it is also possible to merely partially introduce a filling material, for example to close trench structure 148 in the region of the surface.

Figure 7:
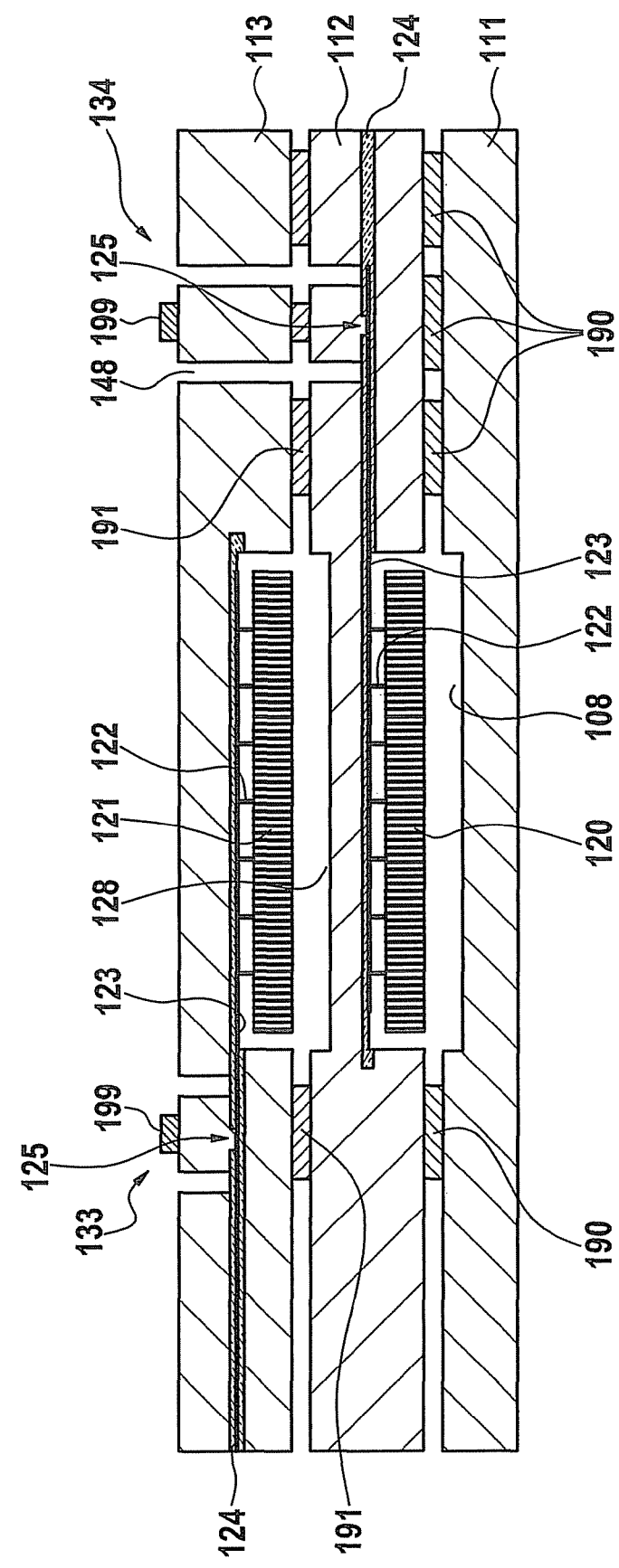

FIG. 7 shows another possible variant of the sensor module of FIG. 5. Contact plungers 133 of sensor module 113 are situated in the region of or directly above bond frame sections of wafer bond connections 190, 191 which enclose functional structures 120, 121 in order to provide hermetically sealed cavities. The surface area of the sensor stack may be further reduced in this way.

Figure 8:
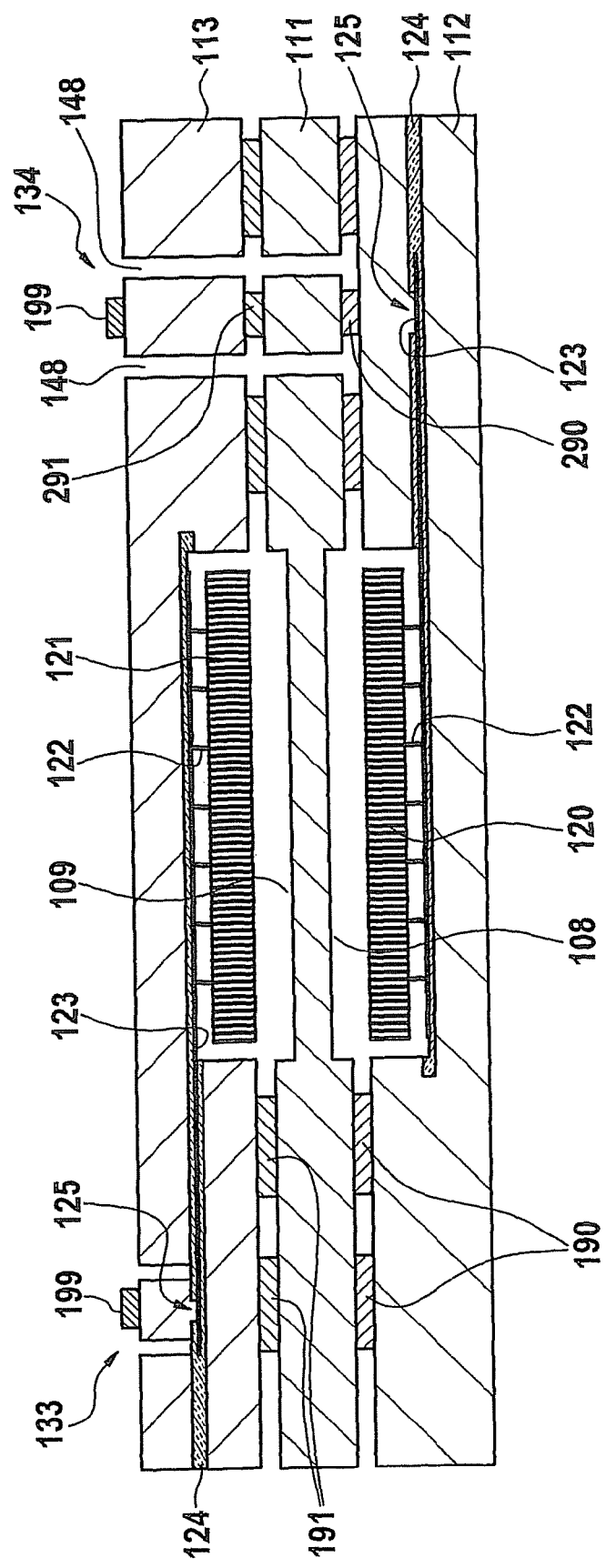

FIG. 8 shows another possible embodiment of a sensor module. In this sensor module, substrate 111 is situated between the two sensor substrates 112, 113. Substrate 111 is used as a "separating substrate" or "separating wafer," as the result of which different gas or pressurized atmospheres may be set in the cavities formed in the region of functional structures 120, 121. Substrate 111 may also have depressions 108, 109 at opposite sides in order to allow greater freedom of motion for movable functional elements of functional structures 120, 121 of the two sensor substrates 112, 113.

During the production of the sensor module of FIG. 8, substrates 111, 112, 113 in the system shown in FIG. 8 are connected to one another by carrying out two successive wafer bonding processes. The two sensor substrates 112, 113 are oriented oppositely with respect to one another, so that each sensor structure 120, 121 is situated opposite from a corresponding side of substrate 111 in each case. In addition, sensor substrates 112, 113 are situated in such a way that opening regions 125 for printed conductor structures 123 are provided at different locations, for example at opposite sides (i.e., right and left sides), as shown in FIG. 8.

Contact plungers 133, 134 are produced on sensor substrates 112, 113 within the scope of an etching process, contact plungers 134 once again being present in the form of feedthrough structures. Contact plungers 134 contain substrate material from the three substrates 111, 112, 113 as well as associated sections 290, 291 of the two wafer bond connections 190, 191. To ensure that contact plungers 134 are electrically conductive, eutectic wafer bonding processes and/or thermocompression bonding processes are carried out to connect substrates 111, 112, 113, as the result of which wafer bond connections 190, 191 each contain an electrically conductive material. In addition, substrates 111, 112, 113 are provided with appropriate doping, at least in the region of contact plungers 134.

Figure 9:
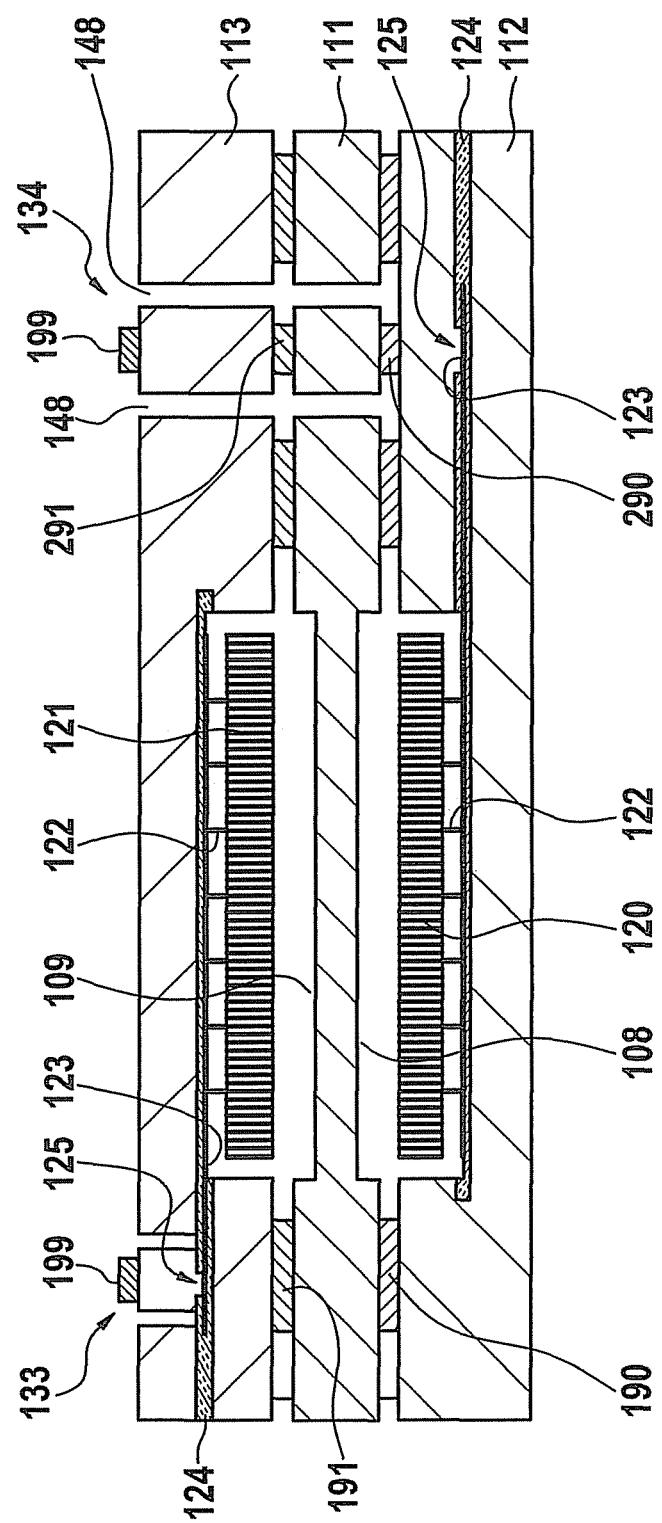

FIG. 9 shows a variant of a sensor module which is slightly modified from FIG. 8, in which contact plungers 133 of sensor substrate 113 once again are situated in the region of or directly above bond frame sections of wafer bond connections 190, 191 which enclose functional structures 120, 121 in order to provide hermetically sealed cavities. The surface area of the sensor module may be further reduced in this way.

Figure 10:
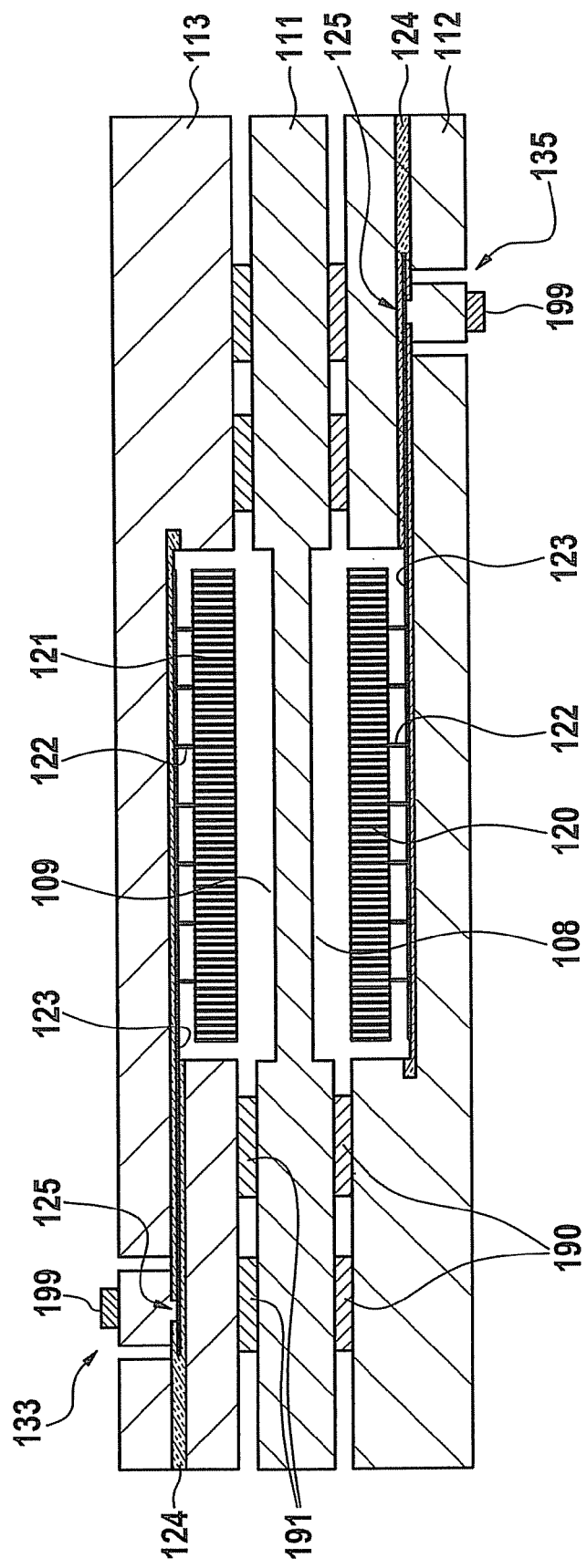

FIG. 10 shows another modification of the sensor module of FIG. 8, in which substrate 111 once again is used as a "separating wafer" and therefore is situated between the two sensor substrates 112, 113. In addition, the sensor substrate has contact plungers 133, 135 which allow electrical access to printed conductor structures 123 and therefore to functional structures 120, 121, in each case from the exposed surface of the two sensor substrates 112, 113. Such a design may be achieved in that after substrates 111, 112, 113 are connected by wafer bonding, contact plungers 135 of sensor substrate 112 are provided in a first etching process, and contact plungers 133 of sensor substrate 113 are provided in a second etching process (or vice-versa). Since no feedthrough structures which include sections of wafer bond connections 190, 191 are provided in this design, in each case a seal glass bonding process may optionally be carried out for connecting substrates 111, 112, 113.

The sensor module of FIG. 10, in which contact plungers 133, 135 are contactable from different sides of the substrate system, offers the option of providing different contacting methods. For example, the sensor module may be mounted and electrically contacted on a support, for example an ASIC chip, on one side (bottom side), using the flip-chip technique, a soldering agent being used which connects contact surfaces 199 of the sensor module and associated contact surfaces of the ASIC chip to one another. On the other hand, bonding wires may be connected to contact surfaces 199 on the other side (top side) of the sensor module in order to connect these contact surfaces, for example, to contact surfaces of the ASIC chip.

Figure 11:
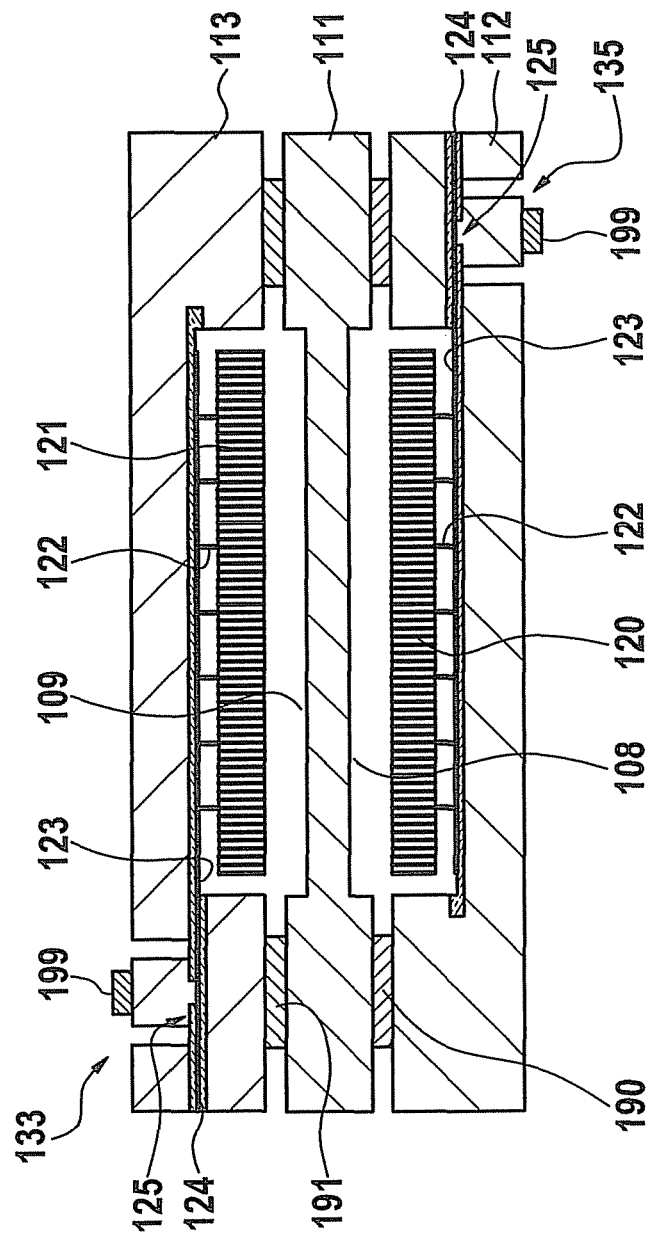

FIG. 11 shows a variant of a sensor module which is slightly modified compared to FIG. 10, in which contact plungers 133, 135 of the two sensor substrates 112, 113 are situated in the region of bond frame sections of wafer bond connections 190, 191, respectively. The surface area of the sensor module may be further reduced in this way. With regard to a separated sensor module, each of the two wafer bond connections 190, 191 may be provided solely in the form of an individual frame-shaped structure which is situated around a corresponding functional structure 120, 121.

In another possible exemplary embodiment, for a substrate system which is produced by wafer bonding, instead of or in addition to a substrate 111 which functions solely as a cap or "separating wafer" a substrate is used which already has integrated circuit structures, with the aid of which signals of sensor substrates 112, 113 may be processed or evaluated.

With the aid of wafer bonding (eutectic or thermocompression bonding), closed cavities may be formed in the region of functional structures 120, 121 of sensor substrates 112, 113, and in addition contact structures may be produced via which functional structures 120, 121 are connected to the integrated circuit structures. Such contact structures may be situated inside or outside the cavities.

For purposes of illustration, one possible exemplary manufacturing method is described in greater detail with reference to FIGS. 12 and 13. In this method, a substrate 114 is initially provided which has an integrated circuit 141. Substrate 114, which may be an ASIC substrate or an ASIC wafer, for example, is referred to below as circuit substrate 114.

Figure 12:
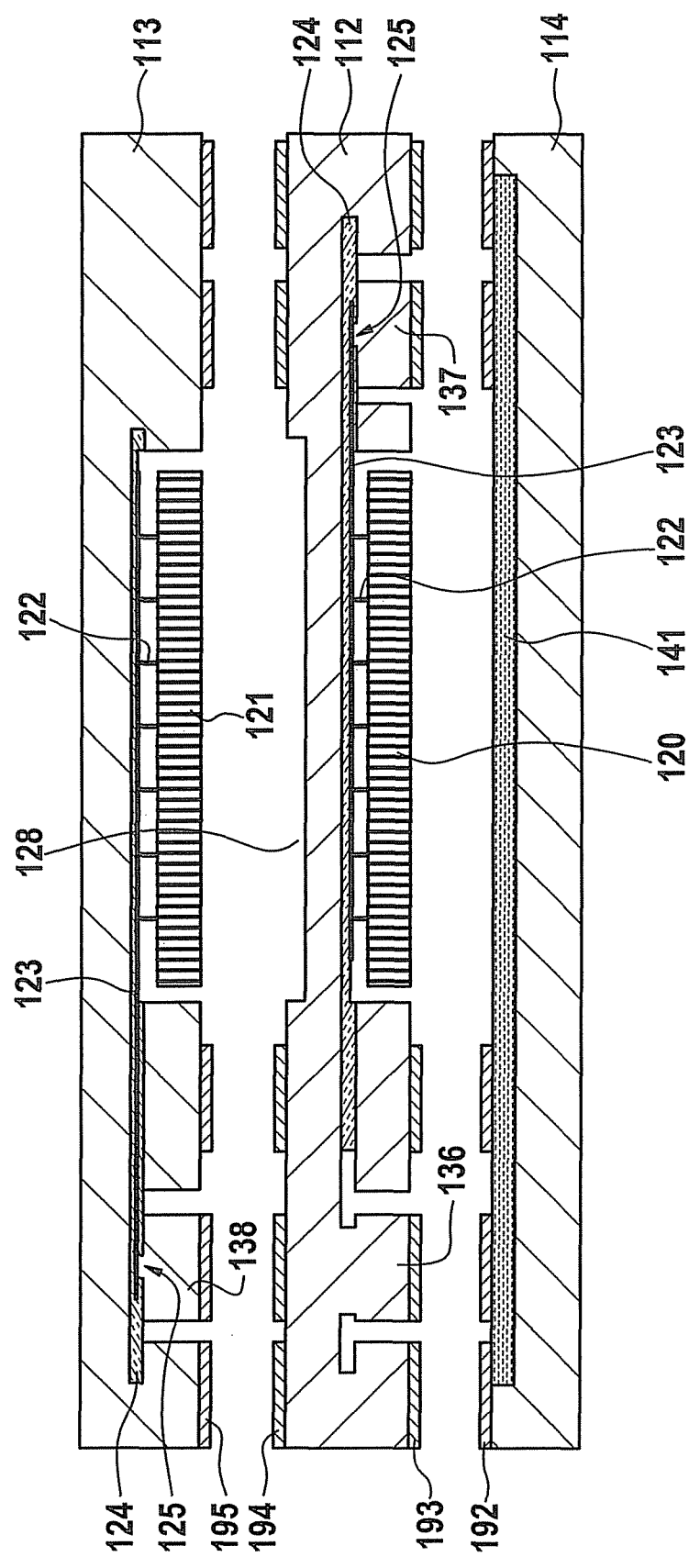
FIGS. 12 and 13 show the manufacture of a further sensor module, in each case in a schematic side illustration.

As illustrated in FIG. 12, a sensor substrate 112 having a functional structure 120 is bonded to circuit substrate 114, with the top side directed downwardly, i.e., upside down, by carrying out a thermocompression bonding process or a eutectic bonding process. For this purpose, the two substrates 112, 114 are provided with bonding materials or bond structures 192, 193 which are metallic or suitable for forming a eutectic. In addition to functional structure 120, sensor substrate 112 has prestructured contact plungers 136, 137 which are situated at different locations, for example at opposite sides (i.e., right and left sides), as shown in FIG. 12, for example. Contact plungers 136 as well as contact plungers 137, of which only one contact plunger 136 or 137 in each case is illustrated in FIG. 12, may be offset with respect to one another, for example perpendicularly to the plane of the drawing in FIG. 12.

Contact plungers 136, 137 may also be made of the material of a (doped) functional layer, from which functional structure 120 also originates. In addition, contact plungers 136, 137 may be produced on sensor substrate 112 at the same time as functional structure 120, or, within the scope of producing functional structure 120, it being possible once again to use trench etching with an insulating layer 124 as an etching stop layer, and gas phase etching.

Contact plungers 137 of sensor substrate 112 are used to establish an electrical connection of a printed conductor structure 123, which is bordered by insulating layer 124 and is connected to functional structure 120, to integrated circuit 141 of circuit substrate 114. For this purpose, corresponding opening regions 125 are provided in insulating layer 124 in the region of contact plungers 137, thus allowing printed conductor structure 123 to directly adjoin contact plungers 137 (or the substrate material thereof).

On the other hand, the other contact plungers 136 form components of subsequently produced feedthrough structures. Therefore, in contrast to contact plungers 137, contact plungers 136 are not situated on insulating layer 124, thus allowing a "vertical" electrical current flow. Contact plungers 136 as well as substrate regions surrounding contact plungers 136 may also have undercuts, as indicated in FIG. 12, which originate from the above-described gas phase etching, in the course of which subregions of insulating layer 124 previously present at these locations have been removed.

Figure 13:
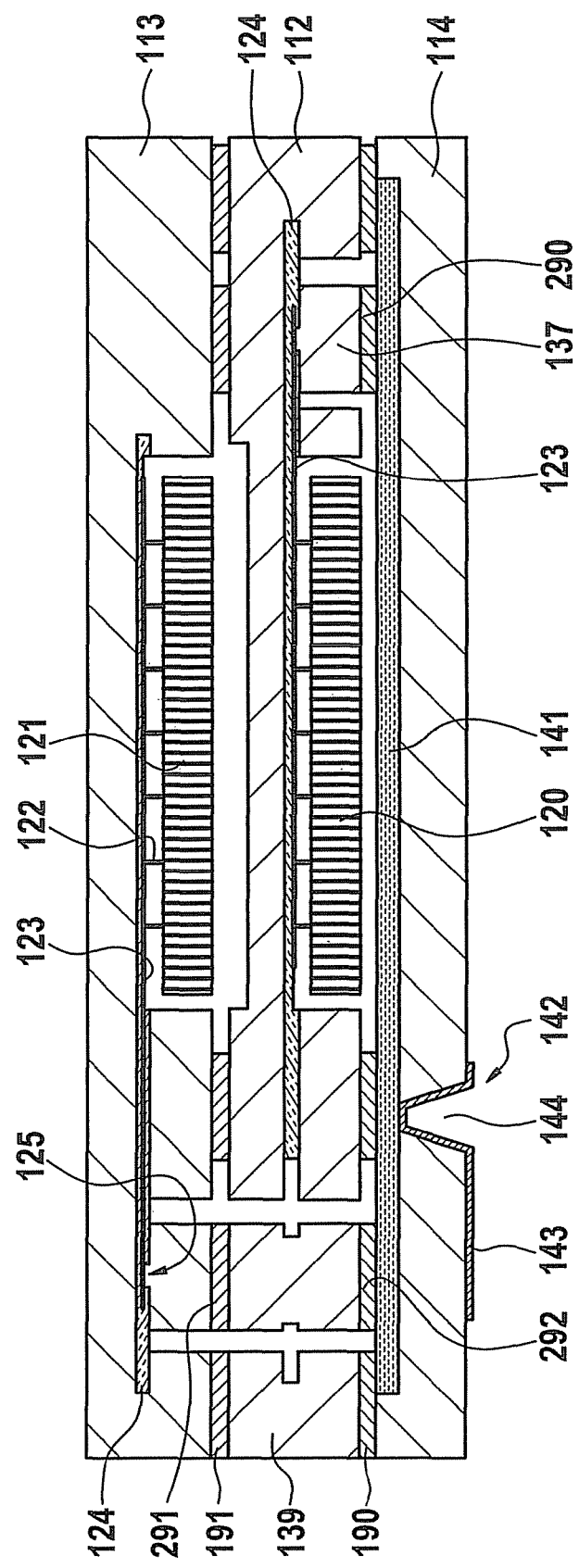

During the wafer bonding process, a metallic or eutectic connecting structure 190 is formed from bond structures 192, 193 of the two substrates 112, 114, as illustrated in FIG. 13. Subsections 290 of connecting structure 190, which are connected to contact plungers 137, are used to connect contact plungers 137, and therefore printed conductor structure 123 and functional structure 120 of sensor substrate 112, to integrated circuit 141.

After sensor substrate 112 is connected to circuit substrate 114, once again sensor substrate 112 may optionally be backthinned. In addition, a trench etching process is carried out on sensor substrate 112, starting at the back side thereof (top side in FIG. 12), in order to provide a trench structure via which contact plungers 136 are completely electrically insulated from the surrounding substrate material (see FIG. 13).

In addition, a depression 128 may be provided at the back side of sensor substrate 112, as illustrated in FIG. 12. Depression 128 is selected with regard to a sensor substrate 113 having a functional structure 121, subsequently applied to substrate 112, in such a way that greater freedom of motion is provided for movable functional elements of functional structure 121. As illustrated in FIG. 12, sensor substrate 113 is bonded to substrate 112 with the top side directed downwardly, i.e., upside down, by carrying out a thermocompression bonding process or a eutectic bonding process.

For the bonding operation, suitable bonding materials or bond structures 194, 195 which are metallic or suitable for forming a eutectic are provided on the two sensor substrates 112, 113. It is pointed out that, unlike the illustration in FIG. 12, bond structure 194 is not produced on sensor substrate 112 until after sensor substrate 112 is connected to circuit substrate 114, and optionally after back-grinding and formation of depression 128.

As illustrated in FIG. 12, in addition to functional structure 121 and a printed conductor structure 123 embedded in an insulating layer 124, sensor substrate 113 has prestructured contact plungers 138 which are connected directly to printed conductor structure 123 via associated opening regions 125. Contact plungers 138, the same as contact plungers 137 of the other sensor substrate 112, may be made of the material of a (doped) functional layer, from which functional structure 121 also originates.

During the wafer bonding process, a metallic or eutectic connecting structure 191 is formed from bond structures 194, 195 of the two sensor substrates 112, 113, as illustrated in FIG. 13. Contact plungers 138 of sensor substrate 113, together with "separated" contact plungers 136 of sensor substrate 112, are thus connected to one another via corresponding subsections 291 of connecting structure 191. In this way feedthroughs 139 are produced which are connected to integrated circuit 141 of circuit substrate 114 via further subsections 292 of the other wafer bond connection 190, thus establishing an electrical connection between functional structure 121 of sensor substrate 113 and integrated circuit 141 of circuit substrate 114.

Subsequently, a back side grinding process may optionally be carried out on sensor substrate 113. In addition, contact elements in the form of feedthroughs may be formed in the region of a lower or back side of circuit substrate 114 for the purpose of contacting integrated circuit 141. FIG. 13 shows one possible example of such a contact element 142. For this purpose, a trench 144 which extends to integrated circuit 141 is formed in substrate 114. Furthermore, a structured metallic layer 143 is formed on the back side of substrate 114 and within trench 144 which is additionally situated on an insulating layer (not illustrated) outside a contact site provided in trench 144. After the sensor module is separated, an electrical connection to other circuit components may be established via such contact elements 142, using standard processes.

In the sensor module in FIG. 13, functional structure 120 of sensor substrate 112 is connected to integrated circuit 141 of circuit substrate 114 via contact plungers 137. Functional structure 121 of sensor substrate 113 is connected to circuit 141 of circuit substrate 114 via feedthroughs 139. Contact plungers 137 are situated within a cavity which is associated with functional structure 120, the cavity being hermetically sealed by wafer bond connection 190 (or corresponding frame-shaped subsections). In contrast, feedthroughs 139 may be situated outside a cavity which is associated with functional structure 121 and which is hermetically sealed by wafer bond connection 191 (or corresponding frame-shaped subsections).

Figure 14:
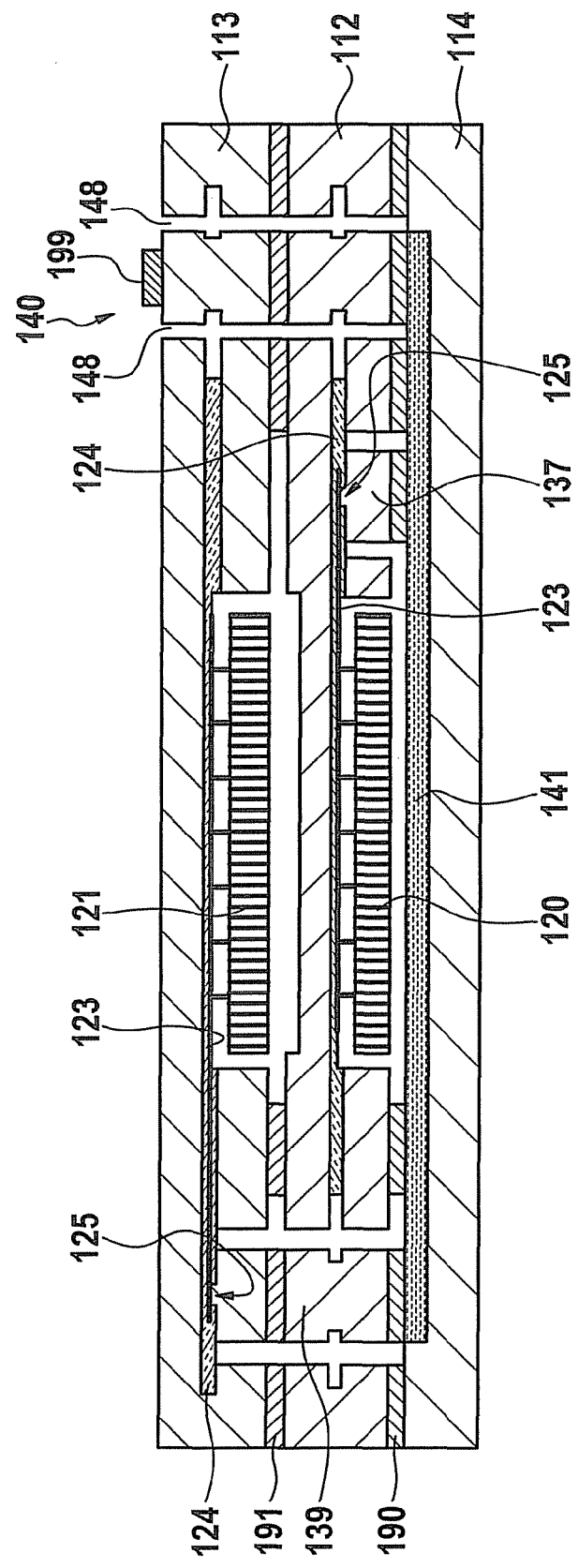

FIG. 14 shows another variant of a sensor module having a circuit substrate 114, which may be manufactured in a similar manner as the sensor module shown in FIG. 13. The sensor module in FIG. 14 has additional contact plungers 140 which are situated on circuit substrate 114 or on its integrated circuit 141 in the form of feedthrough structures, with the aid of which integrated circuit 141 may be contacted from a top side of the sensor module (back side of sensor substrate 113). Contact plungers 140 include corresponding (doped) subsections of substrates 112, 113 and of wafer bond connections 190, 191 provided between substrates 112, 113, and also have contact surfaces 199 situated on the top side of the sensor module. In addition, contact plungers 140, of which only one contact plunger 140 is illustrated in FIG. 14, may be offset with respect to one another, for example perpendicularly to the plane of the drawing in FIG. 14.

For producing such feedthroughs 140, substrate 112 may be provided with a design which is comparable to FIG. 12, contact plungers comparable to contact plungers 136 also being provided in the region of subsequent feedthroughs 140 which are not situated on insulating layer 124 of sensor substrate 112. Such contact plungers provided in the region of subsequent feedthroughs 140 may also be provided on sensor substrate 113. After substrates 112, 113, 114 are connected, contact surfaces 199 may also be formed on the back surface of sensor substrate 113, and a trench etching process may be carried out using an appropriate etching mask. Continuous contact plungers 140 which are surrounded by a trench structure 148 are thus produced. To improve the mechanical stability of contact plungers 140, it may optionally be provided that trench structure 148 is filled with a filling material (not illustrated).

Instead of designing a sensor module having the above-described acceleration sensors and yaw rate sensors, other micromechanical sensors may be considered. One possible example is a pressure sensor.

Figure 15:
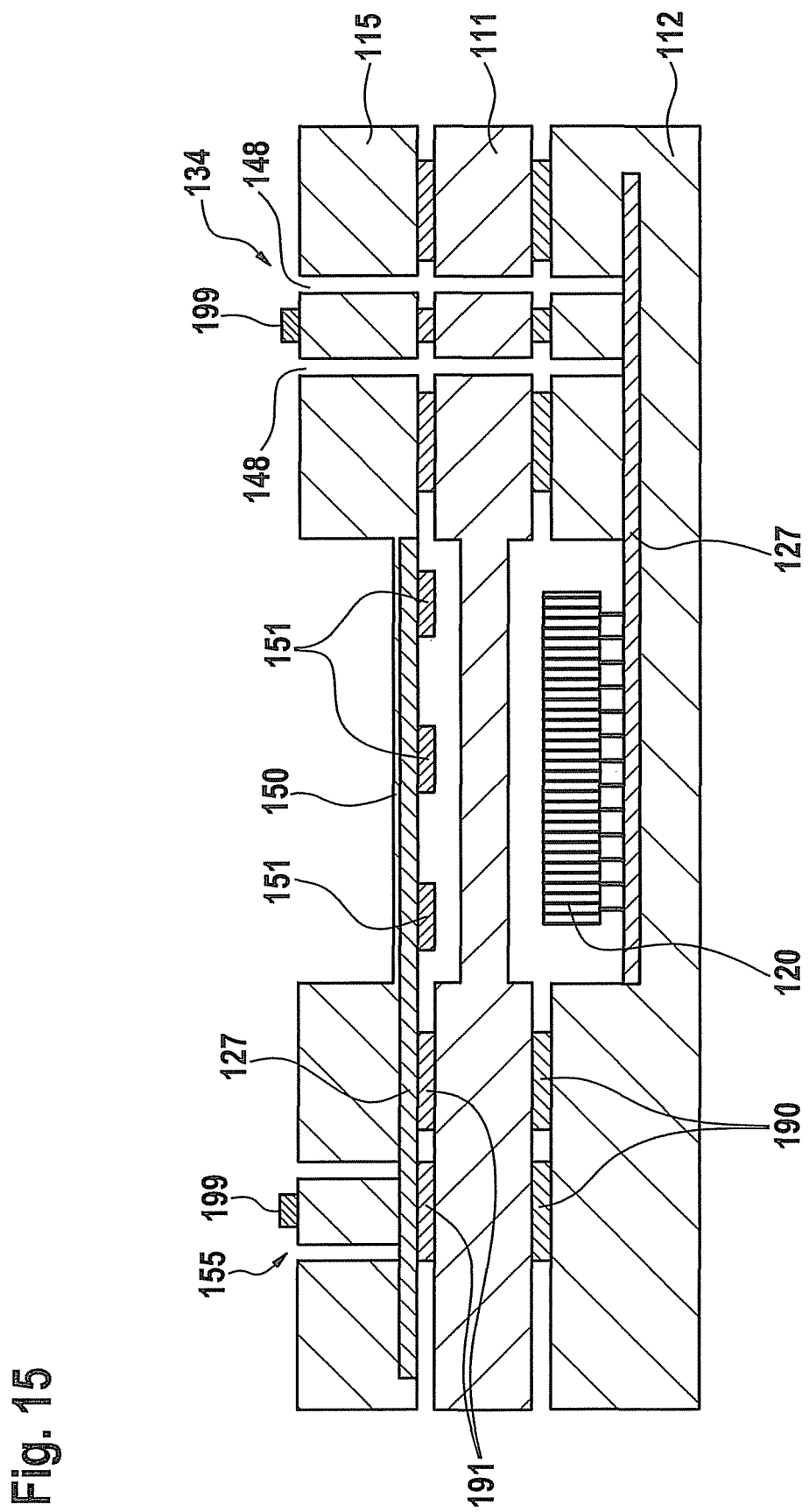

For purposes of illustration, FIG. 15 shows another sensor module which represents a modification of the sensor module in FIG. 9, and which may be manufactured in the same way.

Instead of sensor substrate 113, a sensor substrate 115 is provided which is designed for detecting a pressure. For this purpose, sensor substrate 115 has a pressure-sensitive or deformable diaphragm 150 on one side (downwardly directed in FIG. 15). In addition, piezoresistive elements 151 via which a deformation of diaphragm 150 may be detected are provided on diaphragm 150.

Piezoresistive elements 151 are connected to contact plungers 155 via an appropriate printed conductor structure which is partially bordered by an insulating layer. This system composed of the printed conductor structure and the insulating layer, which in the exemplary embodiment in FIG. 9 may be designed with opening regions in the region of contact plungers 155, is characterized in FIG. 15 by a layer system 127, which for substrate 115 is situated on the downwardly directed side thereof. A corresponding layer system 127 having a printed conductor structure which is connected to contact plungers 134 is also illustrated in FIG. 15 for sensor substrate 112.

After substrates 111, 112, 115 are connected by wafer bonding, contact plungers 155 of sensor substrate 115 together with contact plungers 134 of the other sensor substrate 112 may be produced by carrying out a joint trench etching process. Reference is made to the above discussion for further details.

With regard to sensor substrate 115, it is possible to connect this sensor substrate to substrate 111 via a wafer bond connection 191 in such a way that a hermetically sealed cavity having a predefined inner pressure is formed between substrates 111, 115 in the region of diaphragm 150. In this way the cavity may function as a reference pressure chamber, and sensor substrate 115 may be operated in the form of an absolute pressure sensor. Alternatively, it is possible to not form wafer bond connection 191, which is continuous or which extends in a frame-shaped manner around diaphragm 150, between substrates 111, 115, so that a hermetically sealed cavity is also not present in the region of diaphragm 150. It is thus possible to apply different pressures at opposite sides of diaphragm 150, which may be achieved, for example, by placing the sensor module in FIG. 15 in an appropriately designed housing in order to operate sensor substrate 115 in the form of a differential pressure sensor.

Figure 16:
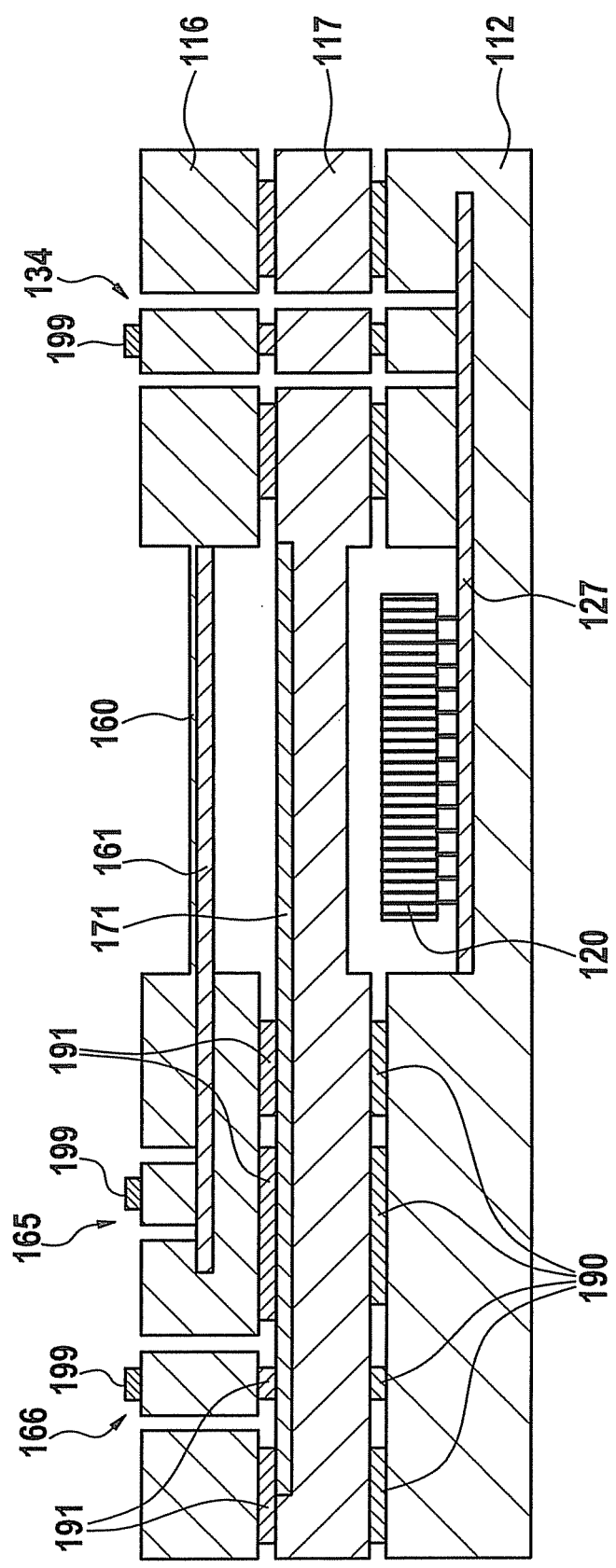

A pressure sensor, i.e., a sensor substrate which is designed for detecting a pressure, may have a different design than substrate 115 in FIG. 15. For purposes of illustration, FIG. 16 shows another possible embodiment of a sensor module which has a sensor substrate 116 including a pressure-sensitive diaphragm 160. Pressure-sensitive diaphragm 160 may be situated in a region between the top and the bottom side of substrate 116. It is provided to capacitively detect a deflection of diaphragm 160. For this purpose, sensor substrate 116 has a printed conductor structure 161 which is insulated with respect to the substrate material of sensor substrate 116 or is partially bordered by an insulating layer, and which includes an electrode in the region of diaphragm 160.

In addition, a substrate or intermediate substrate 117 is provided which has a corresponding printed conductor structure 171 which is insulated with respect to the substrate material of substrate 117 or is partially bordered by an insulating layer. Printed conductor structure 171 includes a counter electrode which is associated with the electrode of printed conductor structure 161, and which is likewise situated in the region of diaphragm 160. A deflection of diaphragm 160 may be capacitively detected via the two electrodes of printed conductor structures 161, 171.

Contact plungers 165, 166 are provided for contacting the two printed conductor structures and electrode structures 161, 171. These may be produced together with contact plungers 134 of the other sensor substrate 112 in a joint etching process, appropriate etching stop layers being able to terminate the etching process on the particular substrates 112, 116, 117.

Also for the sensor module in FIG. 16, it is possible to form sensor substrate 116 as an absolute pressure sensor or differential pressure sensor, which is specified by wafer bond connection 191, i.e., its "tightness."

In addition to sensor substrates having micromechanical functional structures, other sensor substrates may be used which have no movable or deformable functional elements.

Figure 17:
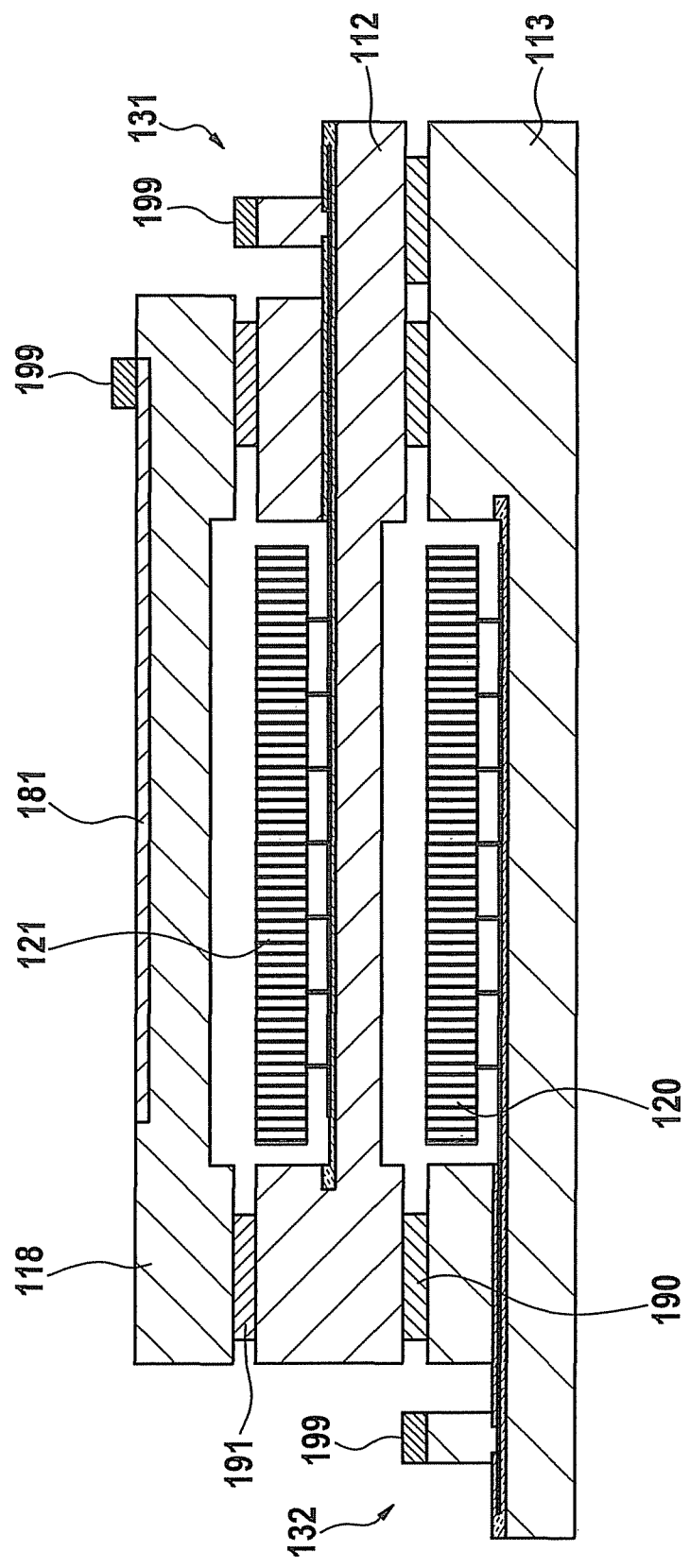

For purposes of illustration, FIG. 17 shows another sensor module which represents a modification of the sensor module in FIG. 4, and which may be manufactured in the same way. Substrate 111, which is used solely as a cap for sensor substrate 112, is replaced by a (further) sensor substrate 118 which has a magnetic sensor structure 181, (possibly having printed conductors) on a top side. In addition, sensor substrate 118 has contact surfaces 199 for contacting magnetic sensor structure 181. Magnetic sensor structure 181 is designed for detecting a magnetic field, in particular the magnetic north, thus allowing the north-south orientation of the sensor module to be determined.

Another embodiment of a sensor module is shown in FIG. 18. This sensor module has a combination of sensor substrate 118 having magnetic sensor structure 181 and a modification of sensor substrate 115 in FIG. 15, in which pressure-sensitive diaphragm 150, the same as sensor substrate 116 in FIG. 16, is situated in a region between the top side and bottom side of sensor substrate 115. The associated sensor structures are contactable via contact plungers 155, 185, which may be produced in a joint etching process after substrates 115, 118 are bonded. In this regard, structure 181 illustrated in FIG. 18 includes printed conductors which are partially bordered by an insulating layer, and which, via appropriate opening regions, may be contacted by contact plungers 185 or corresponding subsections of wafer bond connection 190. With regard to the etching process, the insulating layer may be used as an etching stop layer in the region of contact plungers 185.

The specific embodiments explained with reference to the figures represent preferred or exemplary specific embodiments of the present invention. Instead of the described specific embodiments, other specific embodiments are conceivable which may include further modifications or combinations of described features.

In particular, superposed configurations, i.e., stacks of substrates, may be produced which have a different design than the substrate systems illustrated in the figures. A different number of substrates, circuit substrates, and/or sensor substrates may be considered in particular.

For example, the sensor module in FIG. 4 may be modified in such a way that four sensor substrates which are situated one on top of the other and a further cap substrate are provided. The sensor module may also be designed in such a way that contact plungers of the individual sensor substrates (in the top view) are provided at four different edge sides of the sensor module.

When a circuit substrate which is provided with integrated circuit structures is used, it is possible to situate such a circuit substrate instead between two other substrates or sensor substrates at a top or bottom side of a substrate system. In addition, a substrate system may have more than one circuit substrate.

It is also possible to use different sensor substrates than those described, with the aid of which in particular other characteristics may be detected. These include, for example, the detection of a temperature or the measurement of infrared radiation. In addition to physical characteristics, the detection of chemical characteristics may also be considered. Furthermore, it is conceivable to use sensor substrates which are designed for detecting different characteristics, different sensor structures being provided on the same sensor substrate. One example is a sensor substrate which is designed for detecting an acceleration and a temperature.

With regard to illustrated and described printed conductor structures, it is pointed out that these may be provided in the form of an individual printed conductor level, or also in the form of multiple printed conductor levels situated one on top of the other.

Modifications with regard to the manufacture of a sensor module are also possible. For example, in the etching process for providing contact plungers 131, 132 described with reference to FIGS. 3 and 4, it is alternatively possible to provide an etching mask or corresponding etching mask structures also in the region of contact surfaces 199. In this way, contact plungers 131, 132, comparable to the example of contact plungers 133, 134 in FIG. 5, may have larger lateral dimensions than contact surfaces 199.

What is claimed is:

1. A sensor module, comprising:
a substrate system including multiple substrates situated one on top of the other and connected in each case via a wafer bond connection, multiple substrates including at least one first sensor substrate and at least one second sensor substrate, the first sensor substrate having a first sensor structure and the second sensor substrate having a second sensor structure, the first and second sensor structures being configured to detect different characteristics with respect to each other, at least the first sensor structure including a micromechanical functional structure,
wherein contact plungers contacting the substrate system and situated at different levels of the substrate system are provided in the form of a feedthrough structure enclosed by a trench structure and containing material of at least two different substrates of the substrate system.

2. The sensor module as recited in claim 1, wherein the trench structure is filled with a filling material.

3. The sensor module as recited in claim 1, wherein the contact plungers are contactable from the same or different sides of the substrate system.

4. The sensor module as recited in claim 1, wherein the substrate system includes an additional substrate the additional substrate situated between the first and second sensor substrates or on one side of the substrate system.

5. The sensor module as recited in claim 4, wherein the additional substrate includes integrated circuit structures which are electrically connected to the sensor structures of the first and second sensor substrates.

6. The sensor module as recited in claim 1, wherein at least one of (a) the first sensor substrate and (b) the second sensor substrate is configured to detect at least one of (a) acceleration, (b) yaw rate, (c) pressure, (d) magnetic field, (e) temperature, and (f) infrared radiation.

7. A method for manufacturing a sensor module, comprising:
   connecting multiple substrates with the aid of wafer bonding to form a substrate system composed of the multiple substrates situated one on top of the other, the substrate system including at least one first sensor substrate and at least one second sensor substrate, the first sensor substrate having a first sensor structure and the second sensor substrate having a second sensor structure, the first and second sensor structures being configured to detect different characteristics with respect to each other, at least the first sensor structure including a micromechanical functional structure,
   wherein contact plungers contacting the substrate system and situated at different levels of the substrate system are provided in the form of a feedthrough structure enclosed by a trench structure and containing material of at least two different substrates of the substrate system.

8. The sensor module as recited in claim 1, wherein at least one of (a) the first sensor substrate and (b) the second sensor substrate is configured to detect at least one of (a) acceleration, (b) yaw rate, (c) pressure, (d) magnetic field, and (e) temperature.

* * * * *